United States Patent [19]

Yung et al.

[11] Patent Number: 5,369,407
[45] Date of Patent: Nov. 29, 1994

[54] LINEAR/COMPANDING A/D CONVERTER

[75] Inventors: Henry T. Yung, Richardson; James R. Hochschild, Plano; William A. Severin, Allen, all of Tex.

[73] Assignee: Texas Instruments Incorporated, Dallas, Tex.

[21] Appl. No.: 138,812

[22] Filed: Oct. 18, 1993

Related U.S. Application Data

[63] Continuation of Ser. No. 861,217, Mar. 31, 1992, abandoned.

[51] Int. Cl.$^5$ .............................................. H03M 1/12
[52] U.S. Cl. .................................... 341/172; 341/164
[58] Field of Search ....................... 341/164, 165, 172

[56] References Cited

U.S. PATENT DOCUMENTS

| | | | |
|---|---|---|---|
| 4,404,544 | 9/1983 | Dwarakanath | 341/108 |
| 4,641,130 | 2/1987 | Mastroianni | 341/136 |
| 4,799,042 | 1/1989 | Confalonieri et al. | 341/118 |
| 4,812,817 | 3/1989 | Bernard | 341/172 |
| 4,831,381 | 5/1989 | Hester | 341/172 |
| 4,982,194 | 1/1991 | Bacrania | 341/172 |
| 5,006,854 | 4/1991 | White et al. | 341/172 |

*Primary Examiner*—Marc S. Hoff
*Attorney, Agent, or Firm*—Wade James Brady; Richard L. Donaldson

[57] ABSTRACT

A multi-mode analog to digital converter is described for converting an analog input into a digital value according to a linear or a companding transfer function. The converter comprises a comparator, a successive approximation register and a charge redistribution device. The comparator compares the input voltage and a generated voltage. The successive approximation register generates a provisional binary word responsive to the output of the comparator. The charge redistribution device generates the generated voltage according to the provisional binary word and to a selected transfer function. The transfer function may be selected from the group consisting of linear and companding.

9 Claims, 15 Drawing Sheets

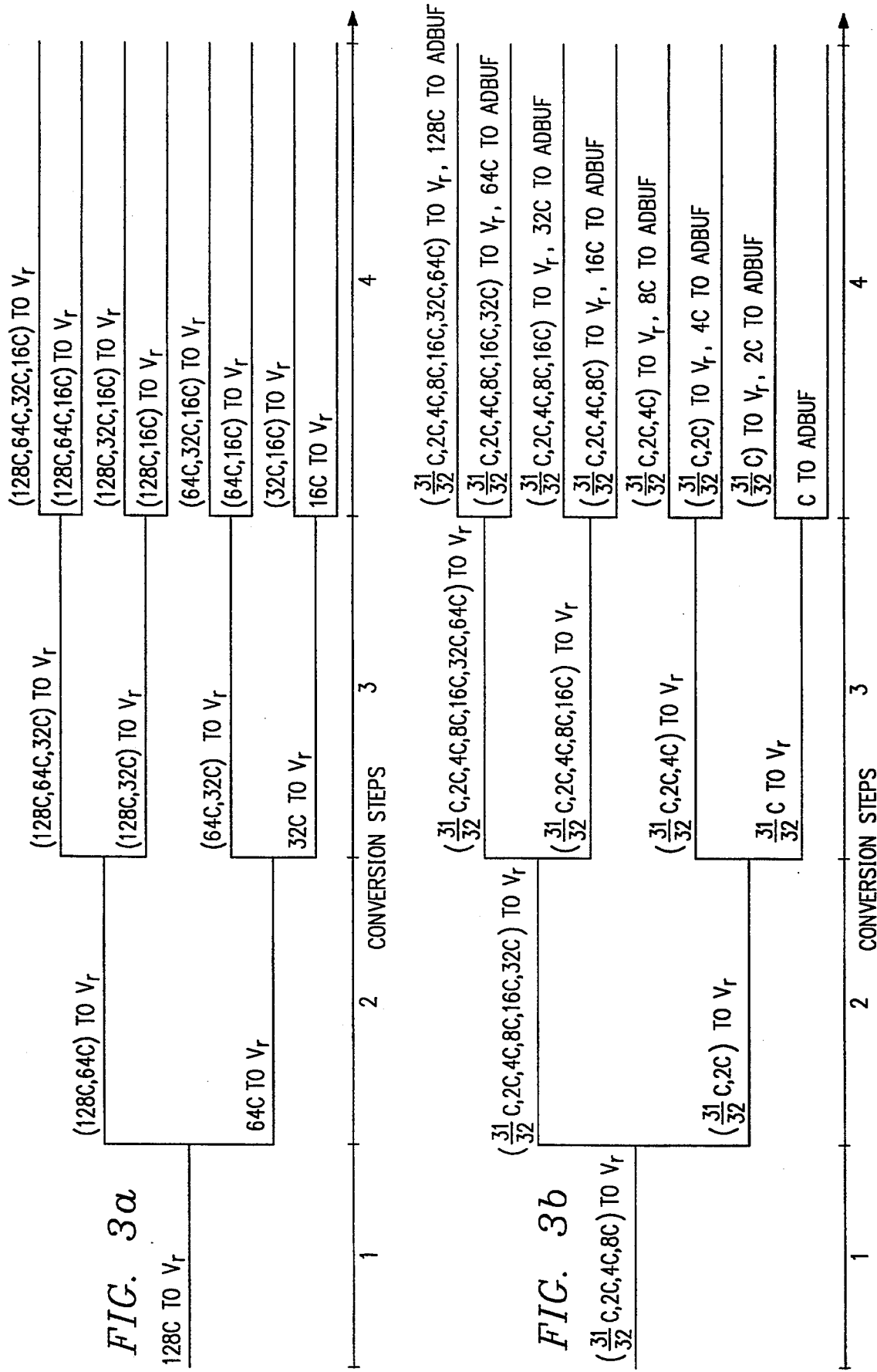

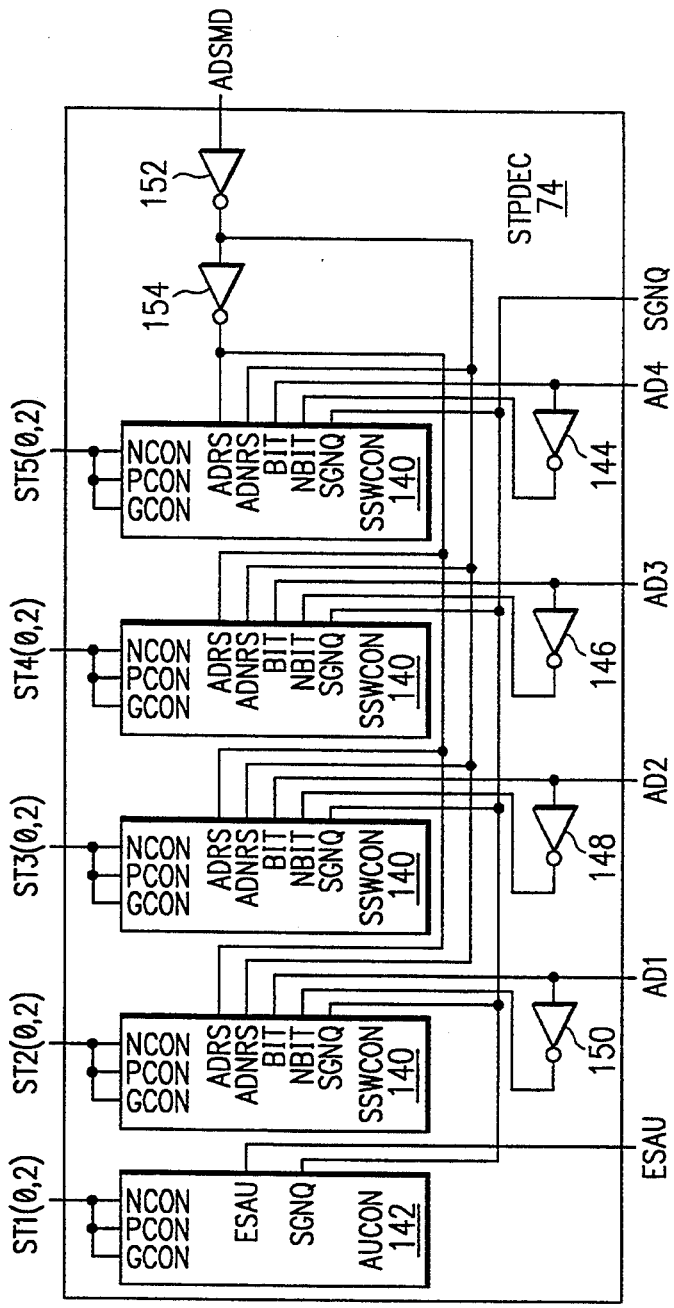
FIG. 11
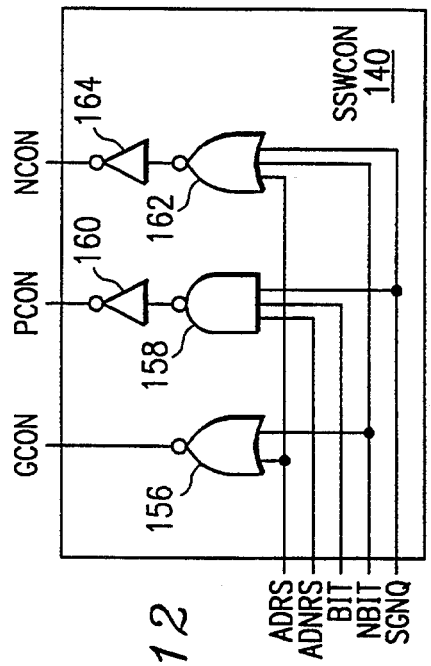
FIG. 13
FIG. 12

5,369,407

LINEAR/COMPANDING A/D CONVERTER

This application is a continuation application Ser. No. 07/861,217, filed Mar. 31, 1992, now abandoned.

TECHNICAL FIELD OF THE INVENTION

This invention relates in general to the field of electronic systems and more particularly to a multi-mode analog to digital converter and method.

BACKGROUND OF THE INVENTION

Analog to digital converters ("ADCs") are electronic devices which generate a digital signal from an analog input. ADCs serve to bridge the gap between digital signal processing and analog signal processing equipment in many areas including computer I/O interfaces, lab test equipment and consumer goods such as digital audio tape recorders.

ADCs convert their analog input to a digital output according to a mathematic transfer function. Linear, A-law companding and $\mu$-law companding are three popular transfer functions known in the art which are widely accepted. Heretofore, ADCs have converted data according to either (1) a linear transfer function, (2) one of the companding functions or (3) either of the companding functions as selected by the user. No known ADC has allowed a user to alternatively convert an analog input into a digital output by a linear or by a companding transfer function. At least two devices have been required to perform all three conversion modes.

Therefore, a need has arisen for an ADC which is operable to convert an analog input into a digital output by either a linear, A-law companding or $\mu$-law companding transfer function.

SUMMARY OF THE INVENTION

In accordance with the present invention, an analog to digital converter is provided which substantially eliminates or reduces disadvantages and problems associated with prior analog to digital converters.

A multi-mode analog to digital converter is described for converting an analog input into a digital value according to a linear or a companding transfer function. The converter comprises a comparator, a successive approximation register and a charge redistribution device. The comparator compares the input voltage and a generated voltage. The successive approximation register generates a provisional binary word responsive to the output of the comparator. The charge redistribution device generates the generated voltage according to the provisional binary word and to a selected transfer function. The transfer function may be selected from the group consisting of linear and companding.

A first technical advantage of the disclosed invention is its flexibility. A user may transfer an analog input into digital output according to any of three transfer functions: linear, A-law companding or $\mu$-law companding.

A second technical advantage of the disclosed invention is its compactness. All three modes of operation are accomplished by a device substantially the same size as prior ADCs.

A third technical advantage of the disclosed system is its accuracy. The ADC employs capacitor arrays in a charge redistribution method. Conventional photolithographic techniques are able to produce matched sets of capacitors which increase the accuracy of the resultant output.

BRIEF DESCRIPTION OF THE DRAWINGS

For a more complete understanding of the present invention, and the advantages thereof, reference is now made to the following descriptions taken in conjunction with the accompanying drawings, in which:

FIGS. 3a and 3b graphically depict a successive approximation decision tree for a linear and a companding transfer function respectively.

FIG. 6 depicts a schematic diagram of the STARRAY block depicted in FIG. 4a;

FIG. 8 depicts a schematic diagram of the STPSW cell depicted in FIG. 4a;

FIG. 10 depicts a schematic diagram of the ADIN block depicted in FIG. 4a;

FIG. 11 depicts a high level diagram of the STPDEC block depicted in FIG. 5;

FIG. 12 depicts a schematic diagram of the SSWCON cell depicted in FIG. 11;

FIG. 13 depicts a schematic diagram of the AUCON block depicted in FIG. 11;

FIG. 15 depicts a schematic diagram of the DASW-CONA block depicted in FIG. 14a;

FIG. 16 depicts a schematic diagram of the DASW-CONB block depicted in FIG. 14a;

FIG. 17 depicts a schematic diagram of the DASW-CONC block depicted in FIG. 14a;

DETAILED DESCRIPTION OF THE INVENTION

The preferred embodiment of the present invention and its advantages are best understood by referring to FIGS. 1 through 23 of the drawings, like numerals being used for like and corresponding parts of the various drawings.

The disclosed invention is described in connection with the following Table of Contents:

I. Mathematical Background
   A. Linear
   B. Companding

1. A-Law Companding
2. μ-Law Companding
II. ADC Overview
  A. Implementation
  B. Operation
III. Electronic Implementation
  A. Signal Description
  B. Analog Overview
  C. Digital Overview
  D. Step Capacitor Array
  E. Segment Capacitor Array
  F. Step Switches
  G. Segment Switches
  H. Segment Array Input Switches
  I. Step Decoder
    1. Step Switch Controller
    2. Companding Controller
  J. Segment Array Decoder
    1. Segment Switch Controller A
    2. Segment Switch Controller B
    3. Segment Switch Controller C
    4. Segment Switch Controller D
    5. Segment Switch Controller E
    6. Segment Switch Controller F
  K. Successive Approximation Register
    1. Sign Bit Latch
    2. Bit Latch

I. MATHEMATICAL BACKGROUND

Figure 1A:
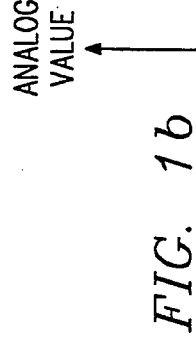
FIGS. 1a and 1b graphically depict a linear and companding transfer function respectively.
Figure 1B:
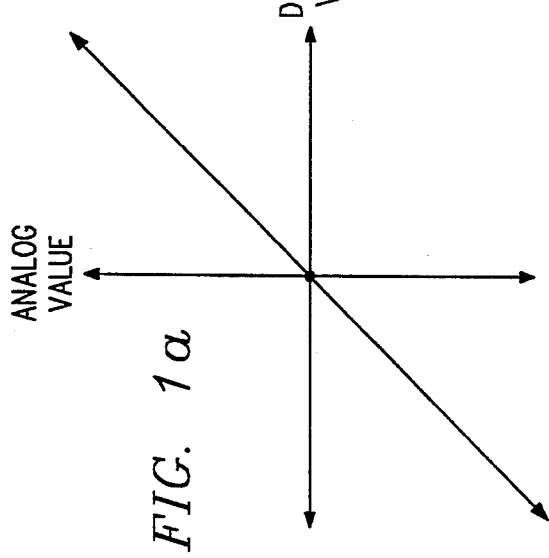

FIGS. 1a and 1b graphically depict a linear and a companding transfer function respectively.

A. Linear

In FIG. 1a, a digital value along the horizontal axis may be related to an analog value along the vertical axis by the simple relationship:

$$|y| = \frac{1}{m} |x/x_{max}|$$

where y is the digital value, x is the analog value, $x_{max}$ is the maximum analog value, and m is the slope of the depicted line. A linear transfer function is appropriate where the expected input values are evenly distributed among all possible choices.

In the illustrated embodiment, a linear data word is thirteen bits long. The first bit is a sign bit indicating whether the analog output is above or below a selected reference value.

B. Companding

Companding ("compressing+expanding") transfer functions are used when accuracy and discrimination around a particular point are more important than linearity. In FIG. 1b, the most important values are those near the origin of the underlying coordinate system. A greater proportion of digital values are allotted to analog values near the origin than to analog values away from the origin. A logarithmic function may be used to describe the depicted curve. For implementation in digital electronics, however, the logarithmic curve is approximated by sixteen linear segments. The end point of each segment is indicated by a dot in the FIGURE. The A-law and μ-law companding transfer functions differ slightly from one another near the origin. In the illustrated embodiment, the companding data word is eight bits long. The first bit is a sign bit indicating whether the analog output is above or below a selected reference value.

1. A-Law Companding

The A-law companding transfer function is given by the relation:

$$|y| = \frac{A|x/x_{max}|}{1 + \log A} \text{ for } 0 \leq |x/x_{max}| \leq 1/A$$

$$|y| = \frac{1 + \log(A|x/x_{max}|)}{1 + \log A} \text{ for } 1/A \leq |x/x_{max}| \leq 1$$

where A=87.6.

2. μ-Law Companding

The μ-law companding transfer function is given by the relationship:

$$|y| = \frac{\log(1 + \mu|x/x_{max}|)}{\log(1 + \mu)}$$

where μ=255.

II. ADC OVERVIEW

A. Implementation

Figure 2:
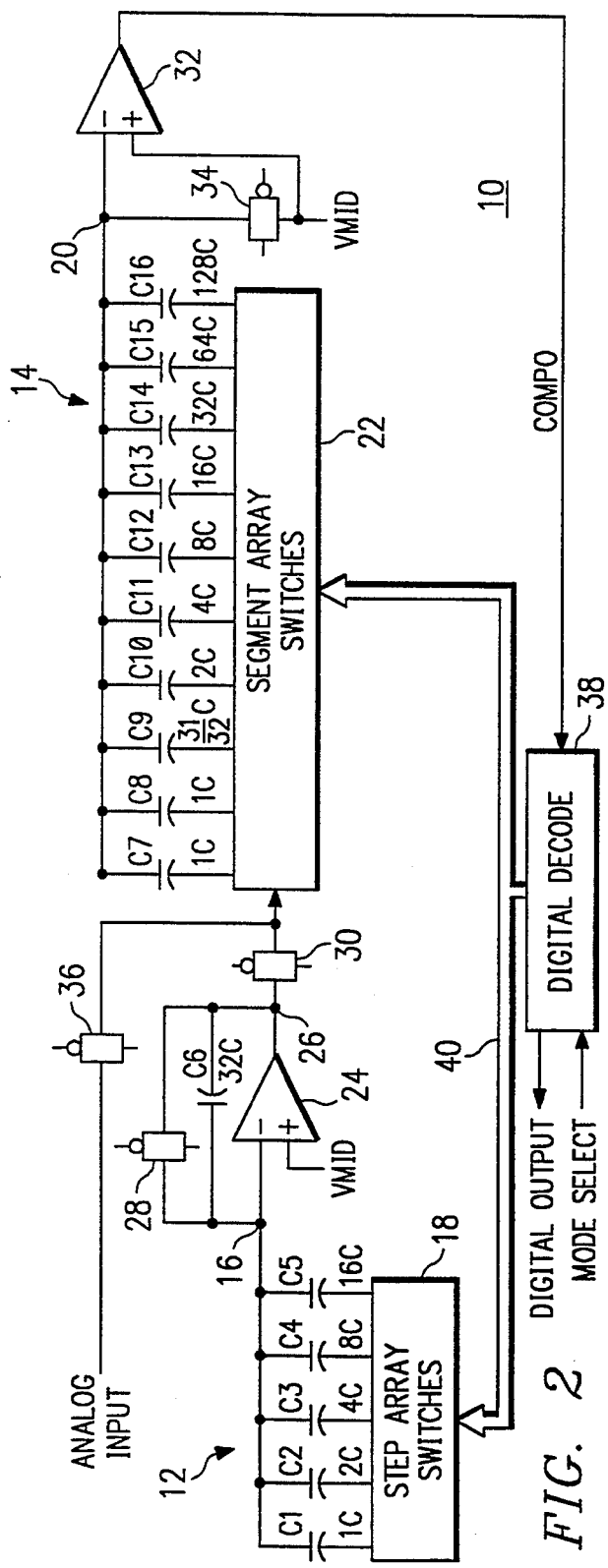
FIG. 2 depicts a high level diagram of the disclosed multi-mode analog to digital converter.

FIG. 2 depicts a high level diagram of the disclosed multi-mode analog to digital convertor, indicated generally at 10. ADC 10 comprises a first array of capacitors indicated generally at 12 comprising capacitors C1 through C5. ADC 10 comprises a second array of capacitors indicated generally at 14 comprising capacitors C7 through C16. As depicted, first terminals of each of the capacitors in array 12 are tied together to form a node 16. The second terminal of each capacitor in array 12 is connected to a block 18 labeled STEP ARRAY SWITCHES. First terminals of each of the capacitors in array 14 are tied together to form a node 20. A second terminal of each capacitor in array 14 is connected to a block 22 labeled SEGMENT ARRAY SWITCHES.

Capacitors C1 through C5 and C7 through C16 are manufactured such that their relative capacitances are precisely known. As depicted, capacitors C1 through C5 have a capacitance of 1C, 2C, 4C, 8C and 16C, respectively, where C is a unit capacitance. Capacitors C7 through C16 have a capacitance of 1C, 1C, (31/32)C, 2C, 4C, 8C, 16C, 32C, 64C and 128C, respectively. In the electronic implementation described below, C=0.2 pF.

Node 16 is connected to the inverting input of an op-amp 24. The non-inverting input of op-amp 24 is tied to a voltage reference level, VMID, while the output is tied to a node 26. Nodes 16 and 26 are connected to each other through two parallel circuit paths. The first circuit path comprises a switch 28. The second path comprises a capacitor C6. Capacitor C6 is also manufactured such that its relative capacitance is precisely known. As depicted, capacitor C6 has a capacitance of 32C. Node 26 may be alternately isolated from or connected to SEGMENT ARRAY SWITCHES 22 by a switch 30.

Node 20 is coupled to the inverting input of a comparator 32. The non-inverting input to comparator 32 is tied to the voltage level, VMID. The output of comparator 32 and generates the digital signal COMPO. Node 20 is coupled to reference voltage VMID through a switch 34. ANALOG INPUT may be switched to block 22 by a switch 36.

STEP ARRAY SWITCHES 18 and SEGMENT ARRAY SWITCHES 22 are controlled by a block 38 labeled DIGITAL DECODE by a control bus 40. STEP ARRAY SWITCHES 18 and SEGMENT ARRAY SWITCHES 22 connect capacitors C1 through C5 and C7 through C16 to one of a plurality of voltages. STEP ARRAY 18 connect each of capacitors C1 through C5 to one of three reference voltages: DAVRM, DAGND, or DAVRP. SEGMENT ARRAY SWITCHES 22 connect each of capacitors C7 through C16 to one of four voltage levels: DAVRM, VMID, DAVRP, or the voltage at node 26. SEGMENT ARRAY SWITCHES 22 may also switch ANALOG INPUT to capacitors C7 through C16.

DIGITAL DECODE block 38 receives two inputs, COMPO and MODE SELECT, and generates a single output DIGITAL OUTPUT. MODE SELECT indicates which of the three transfer functions is to be used by ADC 10 in its conversion of ANALOG INPUT. ADC 10 may use a linear, A-law companding or $\mu$-law companding transfer function. DIGITAL OUTPUT represents the digital value of the converted ANALOG INPUT. The operation of DIGITAL DECODE block 38 varies depending upon the mode select input and is described more fully below.

B. Operation

In all modes of operation, ADC 10 operates as a charge redistribution device and converts an analog voltage level into a digital value by the method of successive approximation.

In a charge redistribution device an initial charge is placed onto a node by connecting the node to a known reference voltage. Here, nodes 16 and 20 are connected to VMID. The node is then isolated by high impedance devices so that the total charge on the node remains constant during the device's operating time. Here, capacitors C1 through C5, capacitors C7 through C16 and op-amp 24 and comparator 32 maintain the initial charge on nodes 16 and 20.

The initial voltage at the node or nodes is varied by selectively connecting a different reference voltage to the second terminal of each capacitor. The potential difference which is generated across the selected capacitors will attract or repel a portion of the initial charge on the node. Whether the potential difference attracts or repels the initial charge depends upon whether the difference between the first and second reference voltages is positive or negative. The change in charge on the terminal of the selected capacitors and on the node will cause a change in voltage at the node, $V_{out}$:

$$V_{out} = \frac{\sum_i C_i \Delta V_i}{\sum_i C_i}$$

where $C_i$ is the capacitance of the ith capacitor and $\Delta V_i$ is the voltage drop across the ith capacitor caused by the switched reference voltage. This voltage can then be used as an intermediate value (node 16) or as an input to a comparator (node 20) by buffering the signal with high input impedance devices. Here, op-amp 24 and comparator 32 act as high input impedance devices.

An ADC converts an analog voltage into a digital value using the method of successive approximation by comparing the analog voltage to a succession of known voltage levels via a comparator. Each voltage level is generated by the ADC from a provisional binary word. If the comparator indicates that the known voltage level is greater than the analog voltage, then the binary word is decreased a certain amount. If the known voltage level is less than the analog voltage, then the binary word is increased the certain amount. The new voltage level indicated by the new binary word is then compared to the analog voltage by the comparator and the binary word accordingly modified. This process is repeated until the provisional binary word equals the input analog voltage. Consequently, for an ADC having n-bits, n conversion steps are required.

FIGS. 3a and 3b graphically depict a successive approximation decision tree for a linear and $\mu$-law companding transfer function, respectively. The dissimilarities between the two trees arise from the difference between how a provisional binary word is decoded in each mode. Also, in the linear mode, the output of op-amp 24 is always connected to capacitor C7. In the companding modes, the output of op-amp 24 is connected to one capacitor in array 14 according to the decoded three most significant bits ("MSBs"): most significant bit-to-least significant bit=000, capacitor C7; 001, capacitor C10; 010, capacitor C11; 011, capacitor C12; ...; and ... capacitor C16.

In both modes of operation, the sign bit or AD13 is initially determined by comparing the input analog value to VMID. If the analog value is greater than VMID, the reference voltage DAVRP is subsequently applied to selected capacitors C7 through C16. If the analog value is less than VMID, the reference voltage DAVRM is subsequently applied to selected capacitors C7 through C16. The opposite reference voltage than that applied to array 14 is applied as Vr to selected capacitors in array 12. The output of array 12 is fed through inverting op-amp 24 before being processed by array 14. The output of op-amp 24 is thereby compatible in sign with array 14.

The analog input voltage is sampled by switching all the bottom plates of the capacitors in array 14 except capacitor C9 to the analog input voltage, "$V_{in}$." Arrays 12 and 14 are isolated from one another by opening switch 30. The bottom plate of capacitor C9 and the top plate of array 14 are connected to VMID by closing switch 34. As a result, a charge proportional to the analog input voltage is stored on the top plate of array 14. At the same time, the bottom plates of the capacitors C1 through C5 are switched to a voltage level DAVGND. Switch 28 is closed so that the top plate of array 12 is discharged through the output of op-amp 24. (VMID and DAVGND are equivalent for this purpose.)

Both switches 28 and 34 are opened. All the bottom plates of the capacitors in array 14 are then switched to DAVGND. The sign bit of the analog input voltage is determined by the output of the comparator. For simplicity, the sign bit is assumed to be positive in the following discussion.

1. Linear

In FIG. 3a, Vr equals the selected reference voltage, DAVRP or DAVRM, as determined by the sign bit. In the linear mode, with a positive sign, the bottom plate of capacitor C16 is connected to the positive reference, Vr. This results in a conversion voltage proportional to $$-\left(V_{in} - \frac{V_r}{2}\right)$$

appearing across the inputs of the comparator, where Vin is ANALOG VOLTAGE. This is conversion step 1. If this voltage is negative, a 1 is recorded as the most significant bit (MSB). The test represented by the upper arm of step 2 is then implemented. Otherwise, a 0 is recorded and the bottom plate of capacitor C16 returns to DAVGND.

The second MSB is then determined by switching the bottom plate of capacitor C15 to Vr. This is conversion step 2. Assuming that the MSB is a 1, a voltage proportional to $$-\left(V_{in} - \frac{V_r}{2} - \frac{V_r}{4}\right)$$

appears across the inputs of the comparator. This corresponds to the test represented by the upper arm of conversion step 2. If this voltage is negative, a 1 is recorded as the second MSB. The test corresponding to the upper branch of step 3 in the decision tree of FIG. 3a is then implemented. Otherwise the test corresponding to the second highest arm in step 3 is implemented. In a similar manner, bits 10 through 5 can be determined.

The output of op-amp 24 is connected to the bottom plate of capacitor C7 in array 14. The successive approximation methodology is continued for the four least significant bits in array 12 as done in array 14. Capacitor C1 is always connected to DAVGND. The decision tree depicted in FIG. 3a therefore continues for eight more steps. Capacitor C1 is switched to the positive reference voltage when the sign bit is high. Capacitor C1 is switched to the negative reference voltage when the sign bit is low.

2. Companding

In FIG. 3b, Vr equals the selected reference voltage, DAVRP or DAVRM, as determined by the sign bit. In the μ-law and A-law companding modes, the bottom plates of capacitors C9 (capacitors C7 and C8 in A-law), C10, C11, and C12 are connected to Vr to determine the MSB. This corresponds to conversion step 1. The particular sequence of switching capacitors C7 through C16 is determined by the 3MSBs of the provisional binary word decoded by DIGITAL DECODE block 38. As in the linear mode, the initial binary word is a one followed by zeroes. In the linear word there are eleven zeroes. In the companding word there are only six zeroes (counting the four least significant bits). In the companding mode, the output of op-amp 26 is switched to the capacitor corresponding to the decoded segment. Vr is switched to all capacitors below the decoded segment and DAVGND is switched to all capacitors above the decoded segment. This scheme allows the companding modes to have the variable step size mandated by the companding transfer functions.

The particular decoded segment is determined by the following scheme: (bit$_7$=0 bit$_6$=0 bit$_5$=0) corresponds to segment 1, 001 corresponds to segment 2, 010 corresponds to segment 3, . . . and 111 corresponds to segment 8. Segments 1 through 8 correspond to capacitors C9 (capacitors C7 and C8 are in A-law) through C16, respectively. A capacitor is below another if its designator is less than the other's designator. A capacitor is above another if its designator is greater than the other's designator. For example, capacitors C9, C11 and C12 are below capacitor C13. Capacitors C14, C15 and C16 are above capacitor C13.

If the MSB is a 1, the second MSB is determined by switching the bottom plates of capacitors C9 (capacitors C7 and C8 in A-law), C10, C11, C12, C13, and C14 to Vr while the remaining bottom plates in array 14 are tied to DAVGND. This corresponds to the upper arm in conversion step 2. Otherwise, the bottom plates of capacitors C9 (capacitors C7 and C8 in A-law) and C10 are switched to Vr. This corresponds to the lower arm in conversion step 2.

To determine the third MSB, assuming that both the MSB and the second MSB are 0, the bottom plate of capacitor C9 (capacitors C7 and C8 in A-law) is connected to Vr. This corresponds to the lowest arm in conversion step 3. If the third MSB is a 1, the bottom plate of capacitor C10 is switched to the output of op-amp 24. This corresponds to the second lowest arm in conversion step 4. Otherwise, for μ-law, the bottom plate of capacitor C9 is returned to DAVGND and capacitor C7 is connected to the output of node 26. This corresponds to the lowest arm in conversion step 4. (For A-law, the bottom plates of capacitors C7 and C8 are switched to the output of node 26.)

Array 12 then continues the successive approximation method similar to the procedure described above in connection with the linear mode. For μ-law companding when the three MSBs equal zero, capacitor C1 is switched to the positive reference voltage when the sign bit is high. Capacitor C1 is switched to the negative reference voltage when the sign bit is low and the MSBs are all zero. When the MSBs are not all zero, capacitor C1 is switched to DAVGND. For A-law companding, capacitor C1 is switched to DAVGND.

III. ELECTRONIC IMPLEMENTATION

A. Signal Description

The following signals are used by the ADC as described subsequently:

AD1 through AD13 are the 13 output bits of the ADC. AD1 is the least significant bit and AD13 is the sign bit. In either companding mode, bits 5 through 9 are not used. During conversion, these comprise the binary provisional word or "try bits."

ADBUF is the output of block ADIN. It is either ANALOG INPUT or BUF.

ADLD is a digital strobe signal initiating on analog to digital decode operation.

ADNRS is the logical inverse of ADSMD. It is used by the step switches to generate the three line control buses.

ADRS is the digital signal ADSMD delayed further.

ADSM is the input signal ADLD delayed.

ADSMD is the signal ADSM further delayed.

ANALOG INPUT is the analog voltage level to be converted to a digital value.

AU is a digital input to the ADC. It is used in conjunction with LINEAR. When LINEAR is low and AU is high, the ADC converts digital data according to an A-law companding transfer function. When both are low, the ADC converts digital data according to a μ-law companding transfer function.

B1A, B1B, B2, and C through I are the analog voltage levels applied to the bottom plate of capacitors C7 through C16, respectively. They are generated by the SEGSW cells. (B2 is generated by a STPSW cell).

B1A(0,3), B1B(0,3), B2(0,2), and C(0,3) through I(0,3) are four-line control buses which drive the SEGSW cells. (Bus B2(0,2) is a three-line control bus. It drives a STPSW cell.)

B5Q through B9Q correspond to the fifth through ninth output bits, respectively of the 13 bit output of block ADSAR.

BIT is a digital input to SSWCON block and to DASWCONB, DASWCOND, DASWCONE, and DASWCONR blocks. It corresponds to one bit of the 13 bit output of the block ADSAR.

BSW is the fourth line in the four-line control buses B1A(0,3), B1B(0,3) and C(0,3) through I(0,3). When high, this bit switches ADBUF to the nth capacitor of the SEGARRAY block.

BUF is the buffered output of the STARRAY block.

CLK is a clocking signal in the block SGNL and in the cell BITL.

CLR is a latch clear signal in the block SGNL and in the cell BITL.

COMPO is the output of the SEGARRAY comparator.

DAVGND is a reference voltage of 2.5 V.

DAVRM is a low impedance precise negative reference voltage of 1 V (VMID−1.5 V).

DAVRP is a low impedance precise positive reference voltage of 4 V (VMID+1.5 V).

EOC is a digital signal generated by the block ADSAR. It indicates the completion of an analog to digital conversion.

ESAU is a digital signal generated by the block SEGDEC. It is used to generate the signal on the first and second lines of the three line control bus ST1(0,2).

GCON is the first data line in the three-line control buses ST1(0,2) through ST5(0,2) and B2(0,2). When low, this bit switches DAVGND to the nth capacitor in the STARRAY block.

GSW is the first data line in the four-line control buses B1A(0,3), B1B(0,3), and C(0,3) through I(0,3). When low, this bit switches VMID to the nth capacitor of the SEGARRAY block.

IBIAS1 is an 18 μA bias current for the op-amp in the STARRAY block.

IBIAS2 is a 30 μA bias current for the comparator in the SEGARRAY block.

LINEAR is a digital input to the ADC. When high, the ADC decodes the ANALOG INPUT according to a linear transfer function. When low, the ADC decodes the analog input according to a companding transfer function according to AU.

M1Q through M3Q correspond to the 12th, 11th and 10th output bits, respectively of the 13 bit output of block ADSAR.

MCOMP is a digital output of the block SIGNL. It is input to the BITL cells. In the n-th conversion step, it corresponds to the (13-n)th bit of the provisional binary word.

MMN is a digital clear signal to the block ADSAR.

NAU is the logic inverse of AU.

NBIT is the logic inverse of BIT.

NCON is the third line in the three-line control buses ST1(0,2) through ST5(0,2) and B2(0,2). When high, this bit switches DAVRM to the nth capacitor in the STARRAY block.

NLINEAR is the logic inverse of LINEAR.

NSW is the third line in the four-line control buses B1A(0,3), B1B(0,3), and C(0,3) through I(0,3). When low, this bit switches DAVRM to the nth capacitor of the SEGARRAY block.

OADB is a set of digital signals. One signal is input to each segment switch controller other than to DASWCONC. They are generated in the SEGDEC block.

OPIN is a set of digital signals. One signal is input to each segment switch controller other than to DASWCONF. They are generated in the SEGDEC block.

PCON is the second line in the three-line control buses ST1(0,2) through ST5(0,2) and B2(0,2). When high, this bit switches DAVRP to the nth capacitor in the STARRAY block.

PSW is the second line in the four-line control buses B1A(0,3), BIB(0,3), and C(0,3) through I(0,3). When high, this bit switches DAVRM to the nth capacitor of the SEGARRAY block.

PWDN is a digital signal which turns off the comparator in SEGARRAY. It is active low.

SARCK is a master clock signal generated externally from the ADC.

SARDIN is SARDOUT received by a BITL cell.

SARDOUT is an output generated by the SGNL block. It is a low-to-high transition which ripples through the BITL cells.

SARNCK is the logical inverse of SARCK. It is generated and used in the block ADSAR.

SGNQ is the logic inverse of SGQ.

SGQ corresponds to the 13th bit of the 13 bit output of block ADSAR.

ST1 through ST5 are analog voltages applied to the bottom plate of capacitors C1 through C5, respectively. They are generated by the STPSW cells.

ST1(0,2) through ST5(0,2) are three-line buses which drive the STPSW cells.

VMID is a low impedance precise mid-reference voltage of 2.5 V.

ZOUT is a digital signal generated by DASWCONC, DASWCOND and DASWCONE. It forces the next higher capacitor to be switched to DAVGND in either companding mode.

ZIN is a ZOUT input received by the next higher segment switch controller.

B. Analog Overview

Figure 4A:
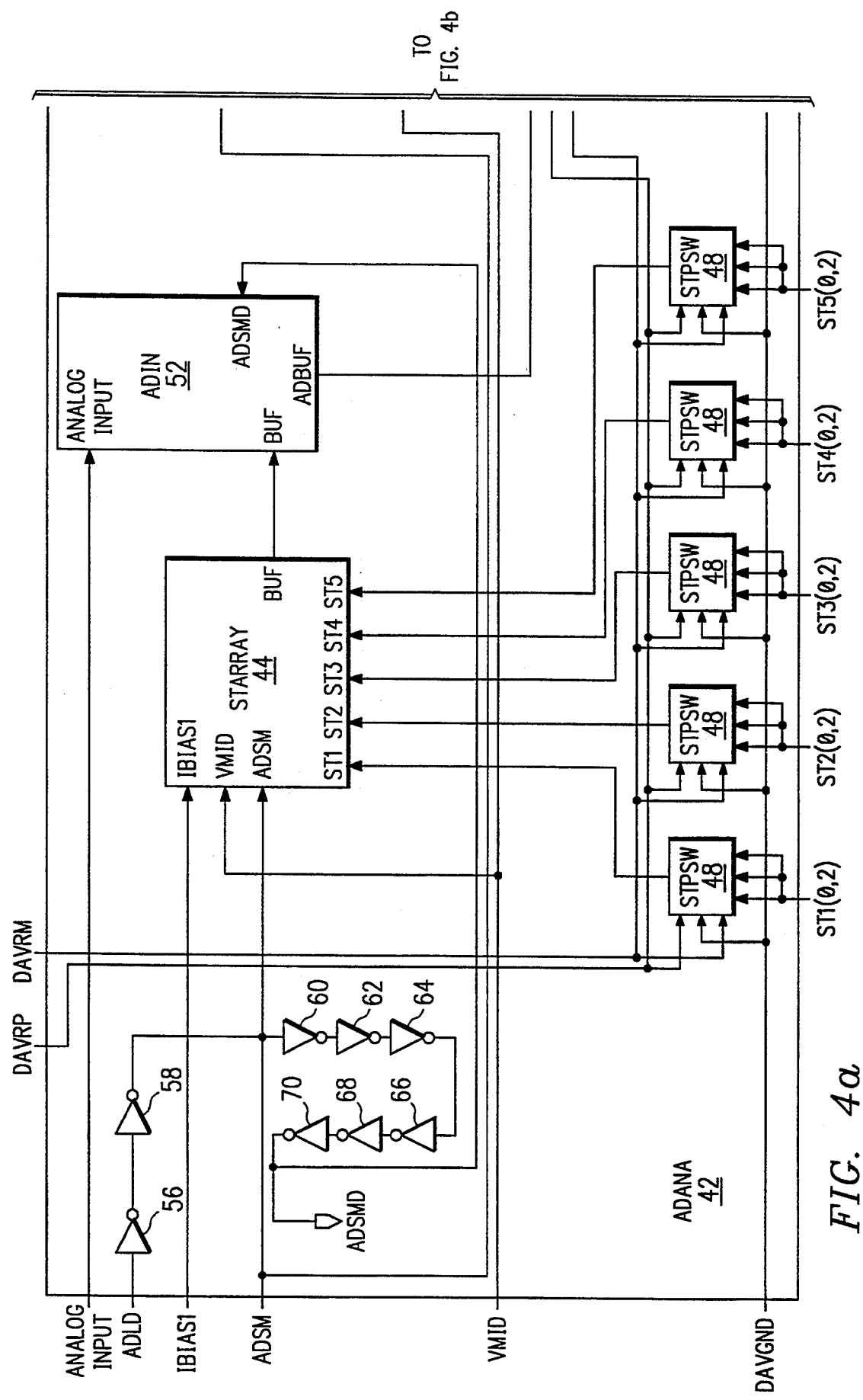
FIGS. 4a and 4b depict a high level diagram of the analog half of the disclosed analog to digital converter.
Figure 4B:
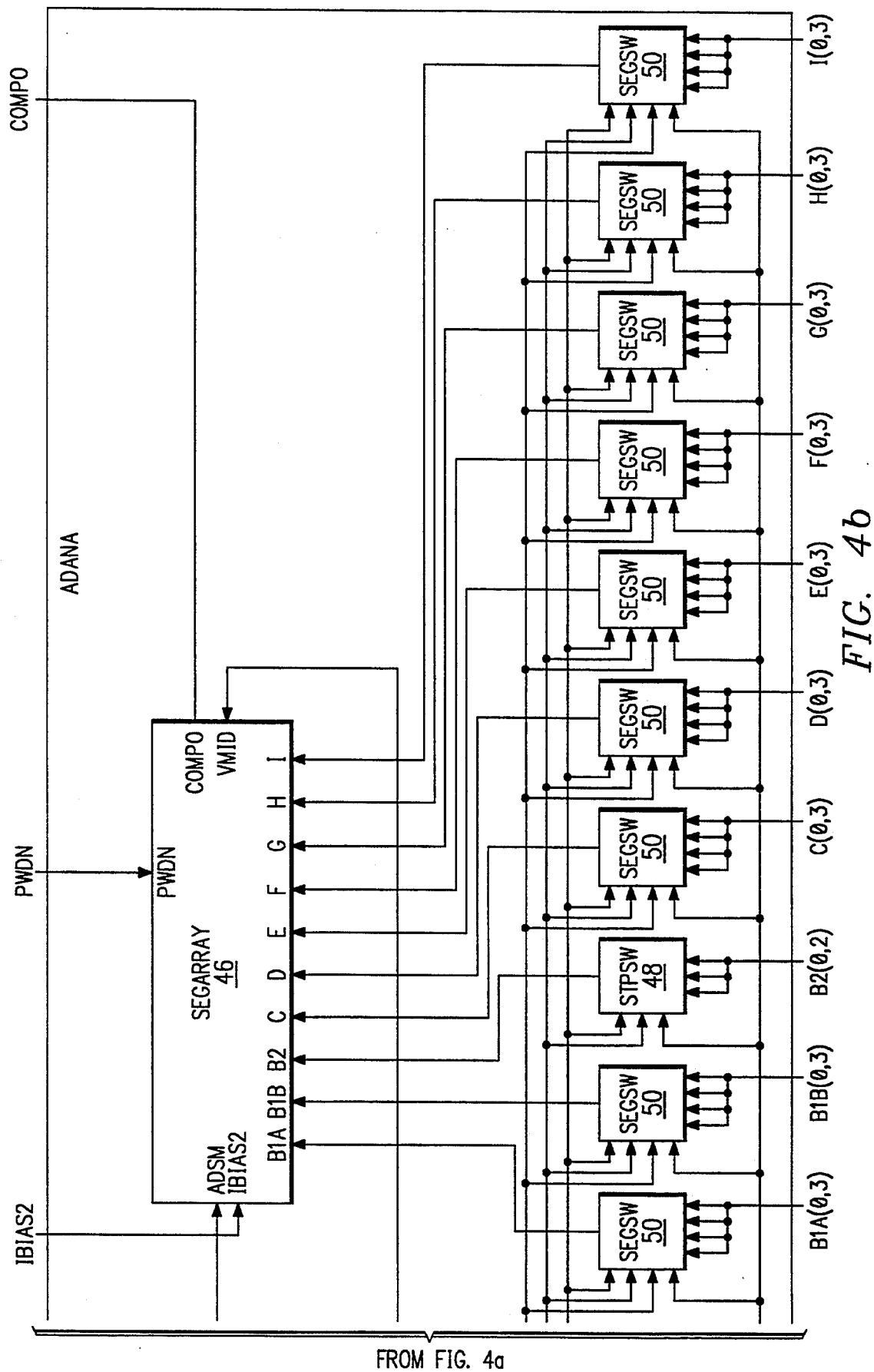

FIGS. 4a and 4b depict a high level diagram of the analog half of the disclosed analog to digital converter indicated generally at 42, labeled ADANA. ADANA block 42 comprises a step capacitor array block 44, labeled STARRAY, a segment capacitor array block 46 labeled SEGARRAY, six step switch cells 48 labeled STPSW, nine segment switch cells 50 labeled SEGSW, and a segment array input switches block 52 labeled ADIN.

STARRAY block 44 generates a buffered analog output, BUF, corresponding to the four least significant bits of the provisional binary word. STARRAY block 44 has inputs IBIAS1, VMID, ADSM and ST1 through ST5. It is more fully described in connection with FIG. 6.

SEGARRAY block 46 generates the digital output COMPO. SEGARRAY block 46 has inputs ADSM, IBIAS2, B1A, B1B, B2, C through I, and VMID. It is more fully described in connection with FIG. 7.

STPSW cell 48 switches one of three reference voltages to a particular capacitor in STARRAY block 44 through ST1 through ST5 and to one capacitor in SEGARRAY block 46 through B2. The particular capacitor which each STPSW cell controls depends upon the particular connection of the cell to STARRAY block 44 and SEGARRAY block 46. Each STPSW cell 48 has a single output, either ST1, ST2, ST3, ST4, ST5 or B2. Each cell has inputs DAVRP, DAVGND, DAVRM and one three-line control bus, either ST1(0,2), ST2(0,2), ST3(0,2), ST4(0,2), ST5(0,2) or B2(0,2). STPSW cell 48 is more fully described in connection with FIG. 8.

SEGSW cell 50 switches one of four voltage levels to a particular capacitor in the SEGARRAY block 46 through B1A, B1B, B2, and C through I. The particular capacitor which each cell SEGSW controls depends upon the particular connection of the cell to SEGARRAY block 46. Each SEGSW cell 50 has a single output, either B1A, B1B, B2, C, D, E, F, G, H, or I. Each cell has inputs DAVRM, DAVRP, DAVGND, ADBUF, and one four-line control bus, B1A(0,3), B1B(0,3), C(0,3), D(0,3), E(0,3), F(0,3), G(0,3), H(0,3) or I(0,3). SEGSW cell 50 is more fully described in connection with FIG. 9.

ADIN block 52 switches either ANALOG INPUT or BUF to the output ADBUF depending upon the logic level of ADSMD. It is more fully described in connection with FIG. 10.

ADANA block 42 also generates the signals ADSMD and ADSM from the input ADLD through the chain of inverters comprising inverters 54, 58, 60, 62, 64, 66, 68, 70. The signal ADSMD is generated from the output of the final inverter 70. The signal ADSM is generated from the output of the second inverter, inverter 58.

C. Digital Overview

Figure 5:
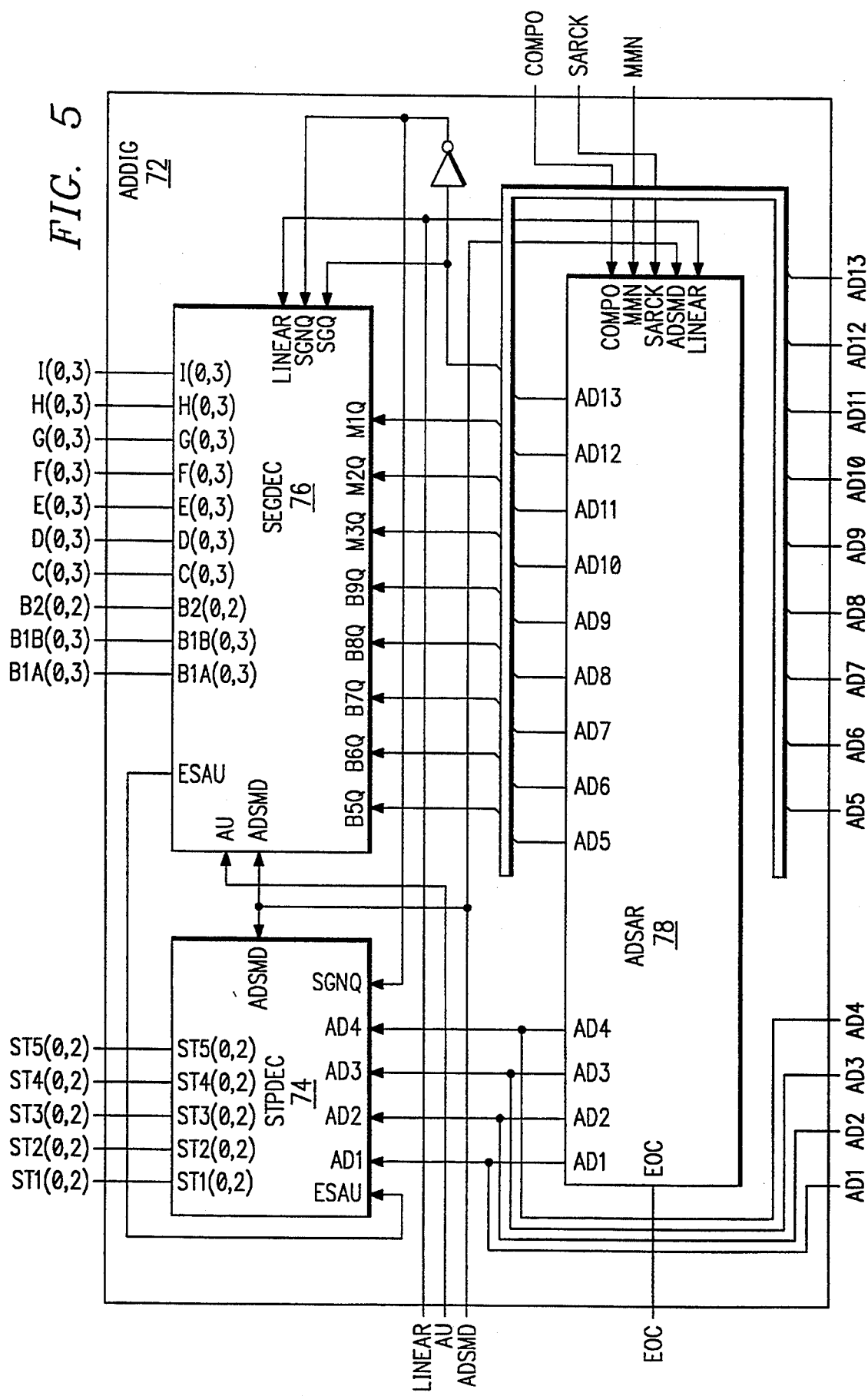
FIG. 5 depicts a high level diagram of the digital half of the disclosed analog to digital converter.

FIG. 5 depicts a high level diagram of the digital half of the disclosed analog to digital converter indicated generally at 72, labeled ADDIG. ADDIG block 72 comprises a step decoder block 74 labeled STPDEC, a segment array decoder block 76 labeled SEGDEC, and a successive approximation register 78 labeled ADSAR. ADDIG block 72 generates the control buses ST1(0,2) through ST5(0,2) and B1A(0,3), B1B(0,3), B2(0,2), C(0,3), D(0,3), E(0,3), F(0,3), G(0,3), H(0,3), I(0,3), the end-of-conversion signal EOC, and the 13 bit DIGITAL OUTPUT, AD1 through AD13.

STPDEC block 74 generates the five three-line control buses ST1(0,2) through ST5(0,2). It has inputs ESAU, AD1 through AD4, SGNQ and ADSMD. It is more fully described in connection with FIG. 11.

SEGDEC block 76 generates the ten four-line control buses B1A(0,3), B1B(0,3), B2(0,2), C(0,3), D(0,3), E(0,3), F(0,30), G(0,3), H(0,3) and I(0,3) . (B2(0,2) is a three-line control bus.) It has inputs LINEAR, SGNQ, SGQ, M1Q through M3Q, B5Q through B9Q, AU and ADSMD. It is more fully described in connection with FIGS. 14a and 14b.

ADSAR block 78 generates the thirteen bit DIGITAL OUTPUT, AD1 through AD13 and the end-of-conversion signal EOC. It has inputs COMPO, SARCK and MMN. It is more fully described in connection with FIG. 21.

D. Step Capacitor Array

Figure 6:
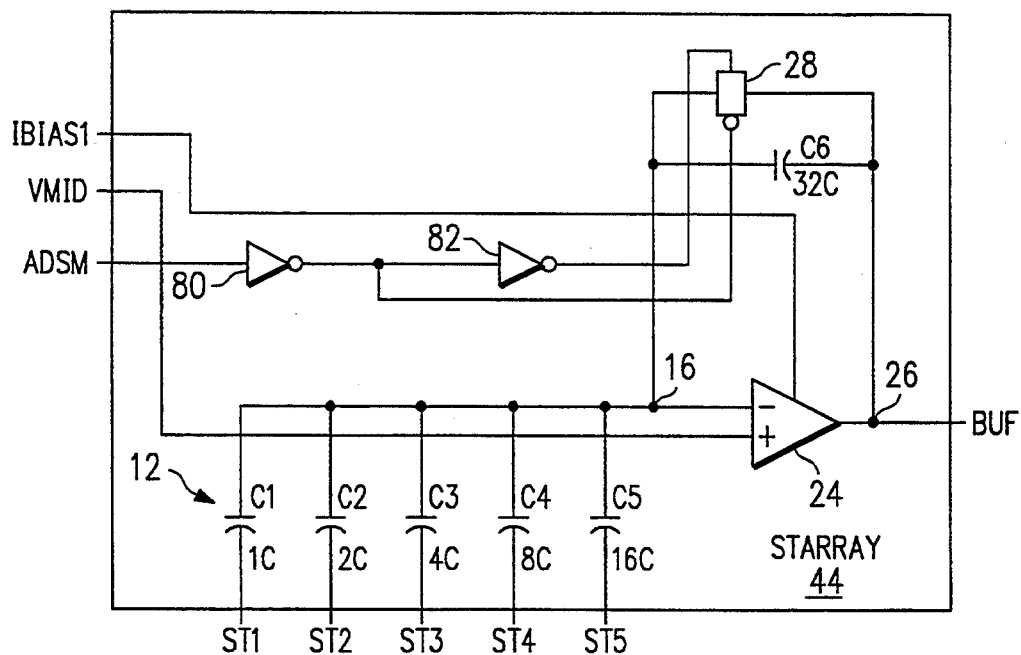

FIG. 6 depicts a schematic diagram of the STARRAY block 44 depicted in FIG. 4a. STARRAY block 44 comprises a high impedance op-amp 24. The noninverting input to op-amp 24 is connected to the reference voltage VMID. The inverting input of op-amp 24 is connected to node 16. The output of op-amp 24 is connected to node 26. Op-amp 24 is biased by the input IBIAS1. Node 16 is connected to the first terminal of each of five capacitors C1 through C6. The second terminal of each capacitors C1 through C5 is connected to the inputs ST1 through ST5. Capacitors C1 through C5 have capacitances 1C, 2C, 4C, 8C and 16C, respectively. Node 26 generates the output BUF.

Two parallel circuit paths connect nodes 16 and 26. The first circuit path connects nodes 16 and 26 through CMOS switch 28. CMOS switch 28 is controlled by the input ADSM after being inverted by inverters 80 and 82 as depicted. The second current path connects node 16 and 26 through capacitor C6. Capacitor C6 has a capacitance of 32C.

In the depicted embodiment, C=0.2 pF.

E. Segment Capacitor Array

Figure 7:
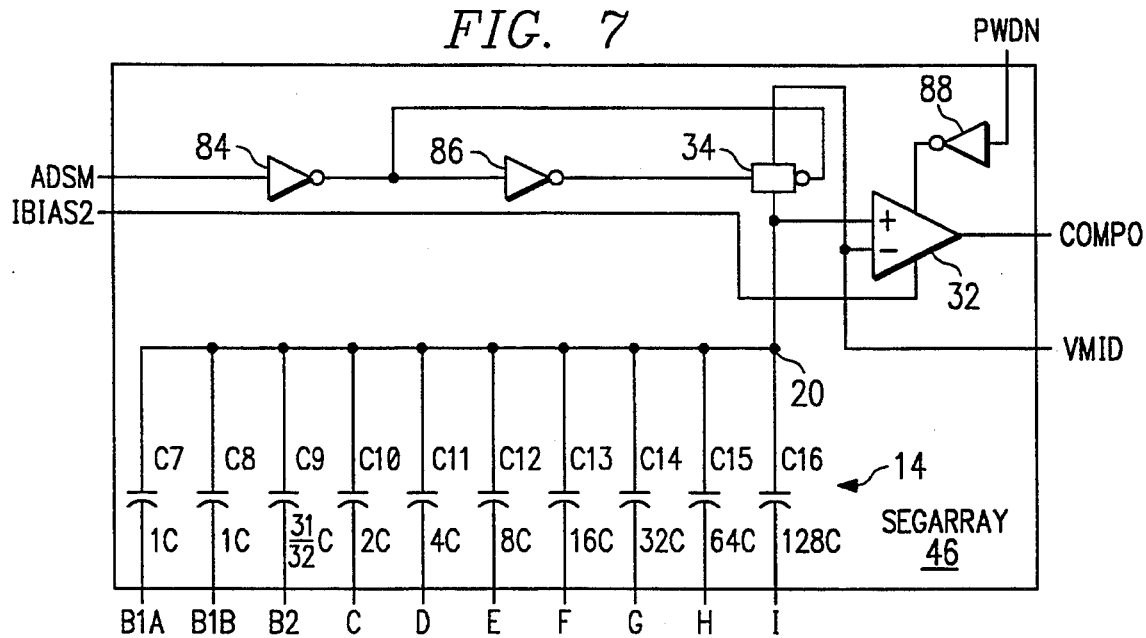
FIG. 7 depicts a schematic diagram of the SEGARRAY block depicted in FIG. 4b.

FIG. 7 depicts a schematic diagram of the SEGARRAY block 46 depicted in FIG. 4b. SEGARRAY block 46 comprises a high input impedance comparator 32. Comparator 32 has its noninverting input connected to node 20. Its inverting input is connected to reference voltage VMID and to node 20 through CMOS switch 34. CMOS switch 34 is controlled by the signal ADSM after being inverted by inverters 84 and 86 as depicted. Comparator 32 is biased by the input IBIAS2 and may be turned off to conserve power by the input PWDN inverted by an inverter 88. The output of comparator 32 generates COMPO.

Node 20 is connected to the first terminal of each of capacitors C7 through C16. The second terminal of each capacitor C7 through C16 is connected to one of the input signals B1A, B1B, B2 and C through I, respectively. Capacitors C7 through C16 have a capacitance of 1C, 1C (31/32)C, 2C, 4C, 8C, 16C, 32C, 64C and 128C, respectively.

F. Step Switches

Figure 8:
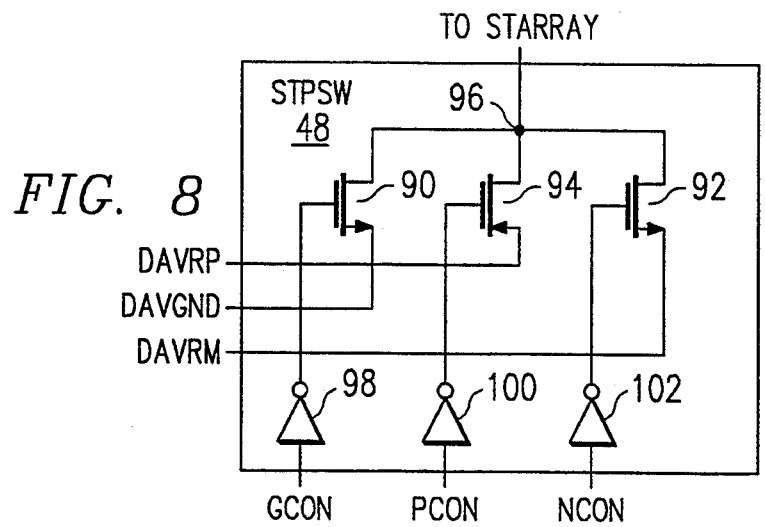

FIG. 8 depicts a schematic diagram of the STPSW cell 48 depicted in FIG. 4a. STPSW cell 48 comprises n-channel transistors 90 and 92 and p-channel transistor 94. The drains of transistors 90 through 94 are connected to a node 96. Node 96 acts as the output of STPSW cell 48 and generates one of the signals ST1 through ST5.

The gate of transistor 90 is connected to the input GCON through an inverter 98. The source of transistor 90 is connected to the reference voltage DAVGND. The gate of transistor 94 is connected to the input PCON through an inverter 100. The source of transistor 94 is connected to the reference voltage DAVRP. The gate of transistor 92 is connected to the input NCON through an inverter 102. The source of transistor 92 is connected to the reference voltage DAVRM.

The inputs to STPSW cell 48, GCON, PCON and NCON form one of the three-line control buses ST1(0,2) through ST5(0,2) and B2(0,2). The output of STPSW cell 48 through node 96 generates one of the control signals ST1 through ST5 and B2. The particular control bus and control line is determined by the position of STPSW cell 48 in FIG. 4a.

G. Segment Switches

Figure 9:
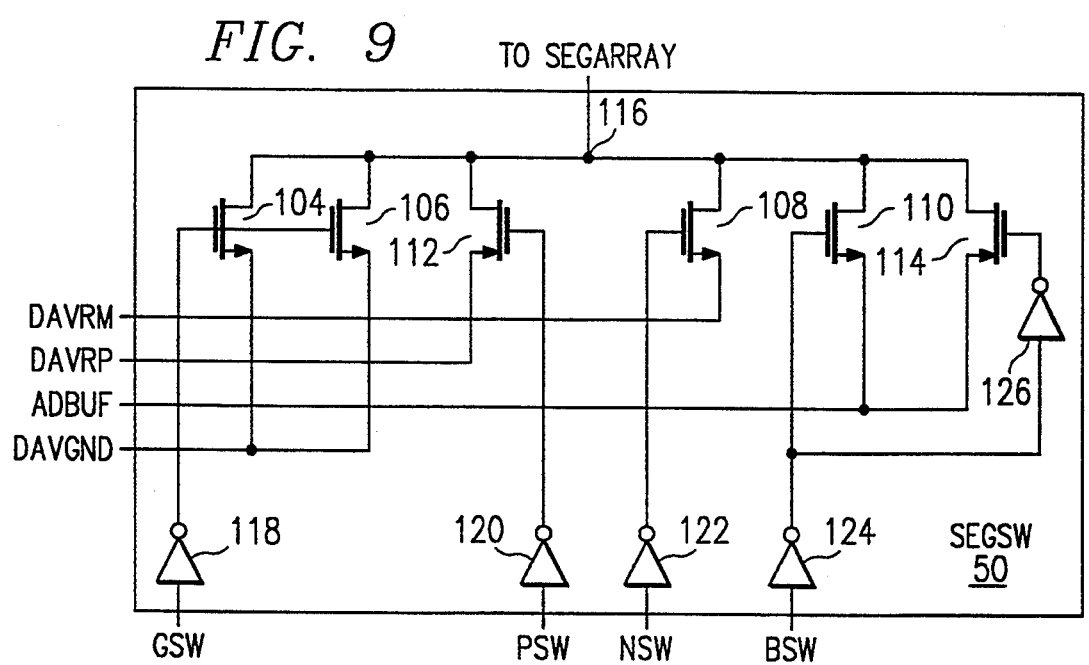
FIG. 9 depicts a schematic diagram of the SEGSW cell depicted in FIG. 4b.

FIG. 9 depicts a schematic diagram of the SEGSW cell 50 depicted in FIG. 4b. SEGSW cell 50 comprises n-channel transistors 104, 106, 108 and 110 and p-channel transistors 112 and 114. The drains of transistors 104 through 114 are connected to a node 116. Node 116 acts as the output of SEGSW cell 50. The gate of transistors 104 and 106 are connected to the input GSW through an inverter 118. The sources of transistors 104 and 106 are connected to a reference voltage DAVGND. The gate of transistor 112 is connected to the input PSW through an inverter 120. The source of transistor 112 is connected to a voltage reference DAVRP. The gate of transistor 108 is connected to the input NSW through an inverter 122. The source of transistor 108 is connected to a voltage reference DAVRM. The gate of transistor 110 is connected to the input BSW through an inverter 124. The gate of transistor 114 is also connected to the input BSW through an inverter 126 and inverter 124. The sources of transistors 110 and 114 are tied to the input ADBUF.

The inputs to SEGSW cell 50, GSW, PSW, NSW and BSW form one of the ten four-line control buses B1A(0,3), B1B(0,3), C(0,3), D(0,3), E(0,3), F(0,3), G(0,3), H(0,3) and I(0,3). The output of SEGSW cell 50 forms one of the control signals, B1A, B1B, C, D, E, F, G, H or I. The particular control bus and control line is determined by the position of SEGSW cell 50 in FIG. 4b.

H. Segment Array Input Switches

Figure 10:
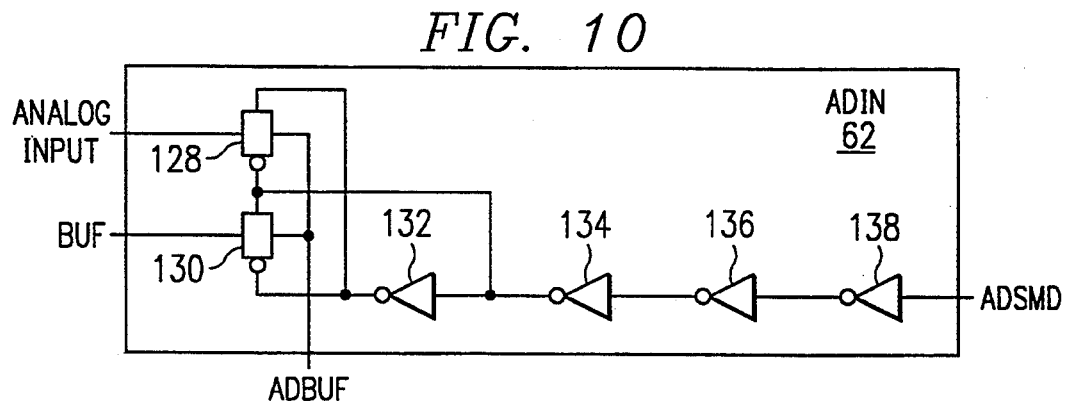

FIG. 10 depicts a schematic diagram of the ADIN block 52 depicted in FIG. 4a. This block alternately connects inputs ANALOG INPUT or BUF to output ADBUF by the input ADSMD. ADIN block 52 comprises CMOS switches 128 and 130. The conductance of switch 128 is controlled by the signal ADSMD delayed and inverted by inverters 132, 134, 136 and 138. The conductance of CMOS switch 130 is controlled by the input ADSMD delayed by the same chain of inverters. As depicted, CMOS switches 128 and 130 are coupled to the signal ADSMD in an asymmetric fashion such that one, and only one switch conducts at a time.

I. Step Decoder

FIG. 11 depicts a high level diagram of STPDEC block 74 depicted in FIG. 5. STPDEC block 74 generates the five three-line control buses ST1(0,2) through ST5(0,2). STPDEC block 74 has inputs ESAU, AD1 through AD4, SGNQ and ADSMD. STPDEC block 74 comprises four step switch controller cells 140 labeled SSWCON and a single companding controller block 142 labeled SSWCON. Each SSWCON cell 140 generates one of the four three-line control buses ST2(0,2) through ST5(0,2). Each has inputs ADRS, ADNRS, BIT, NBIT and SGNQ. The particular input to BIT and NBIT and the particular output control bus is determined by the position of SSWCON cell 140 in STPDEC block 74. SSWCON cell 124 is further described in connection with FIG. 12.

AUCON block 142 generates the three-line control bus ST1(0,2). It has inputs, ESAU and SGNQ. AUCON block 142 is further described in connection with FIG. 13.

STPDEC block 74 further comprises inverters 144, 146, 148, 150, 152 and 154. Inverters 144 through 150 generate the logic inverse of inputs AD1 through AD4. The output from inverters 144 through 150 are fed into the NBIT inputs of each of the SSWCON cells 140. Inverter 152 generates the signal ADNRS from ADSMD. Inverter 154 generates the input signal ADRS from the signal ADNRS. These latter two signals are input into each SSWCON cell 140.

1. Step Switch Controller

FIG. 12 depicts a schematic diagram of the SSWCON cell 140 depicted in FIG. 11. The output GCON is generated by the output of a NOR gate 156. Gate 156 has inputs ADRS and NBIT. The output PCON is generated by the output of a three-input NAND gate 158 inverted by an inverter 160. Gate 158 has inputs ADNRS, BIT and SGNQ. The output NCON is generated by the output of a three-input NOR gate 162 inverted by an inverter 164. Gate 162 has inputs ADRS, NBIT and SGNQ.

2. Companding Controller

FIG. 13 depicts a schematic diagram of the AUCON block 142 depicted in FIG. 11. The output GCON is generated from the input ESAU inverted by an inverter 166. The output PCON is generated by the output of a NOR gate 168. Gate 168 has inputs ESAU and SGNQ. The output NCON is generated by the output of a NAND gate 170. Gate 170 has inputs GCON and SGNQ.

J. Segment Array Decoder

Figure 14A:
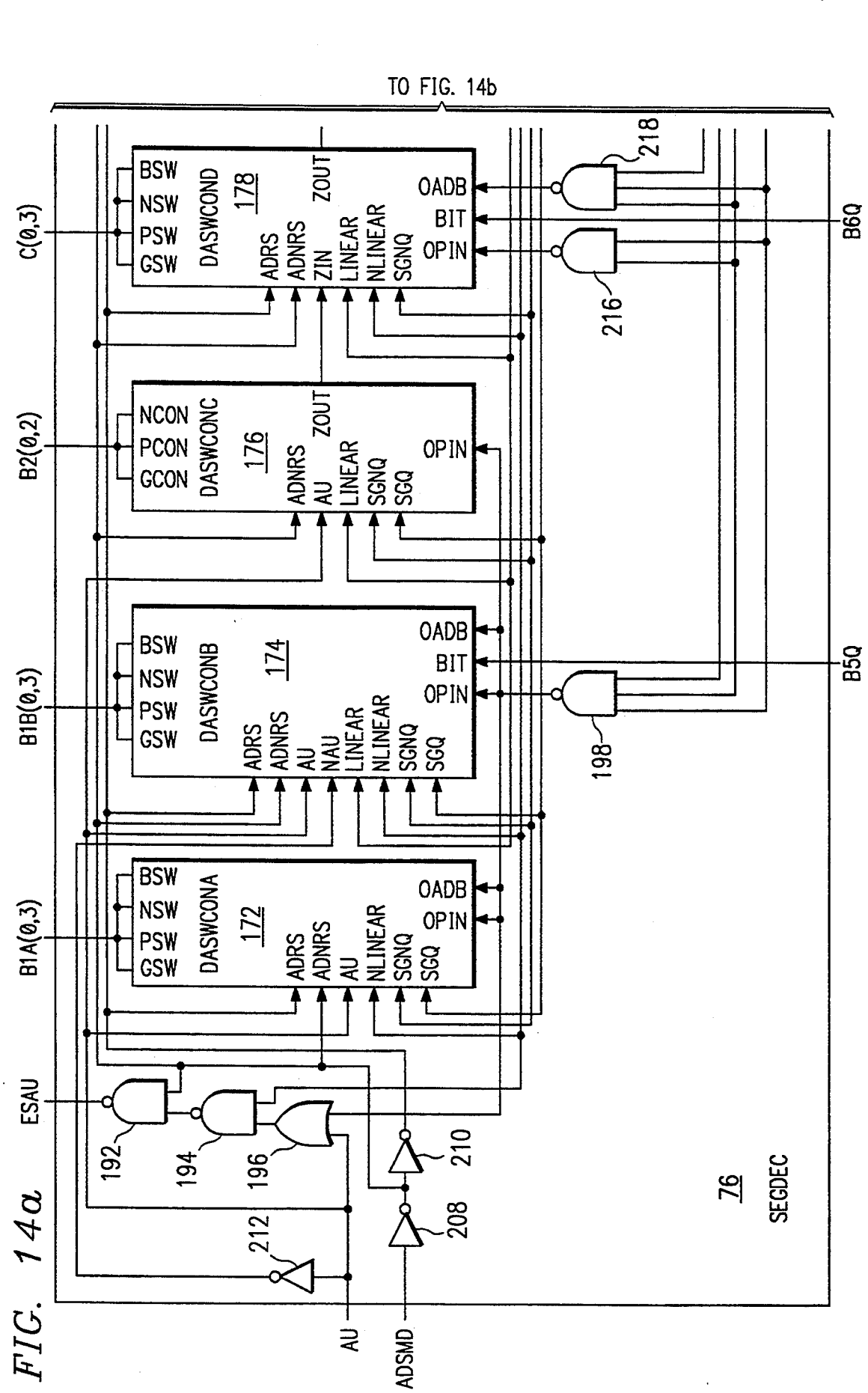
FIGS. 14a and 14b depict a high level diagram of the SEGDEC block depicted in FIG. 5.
Figure 14B:
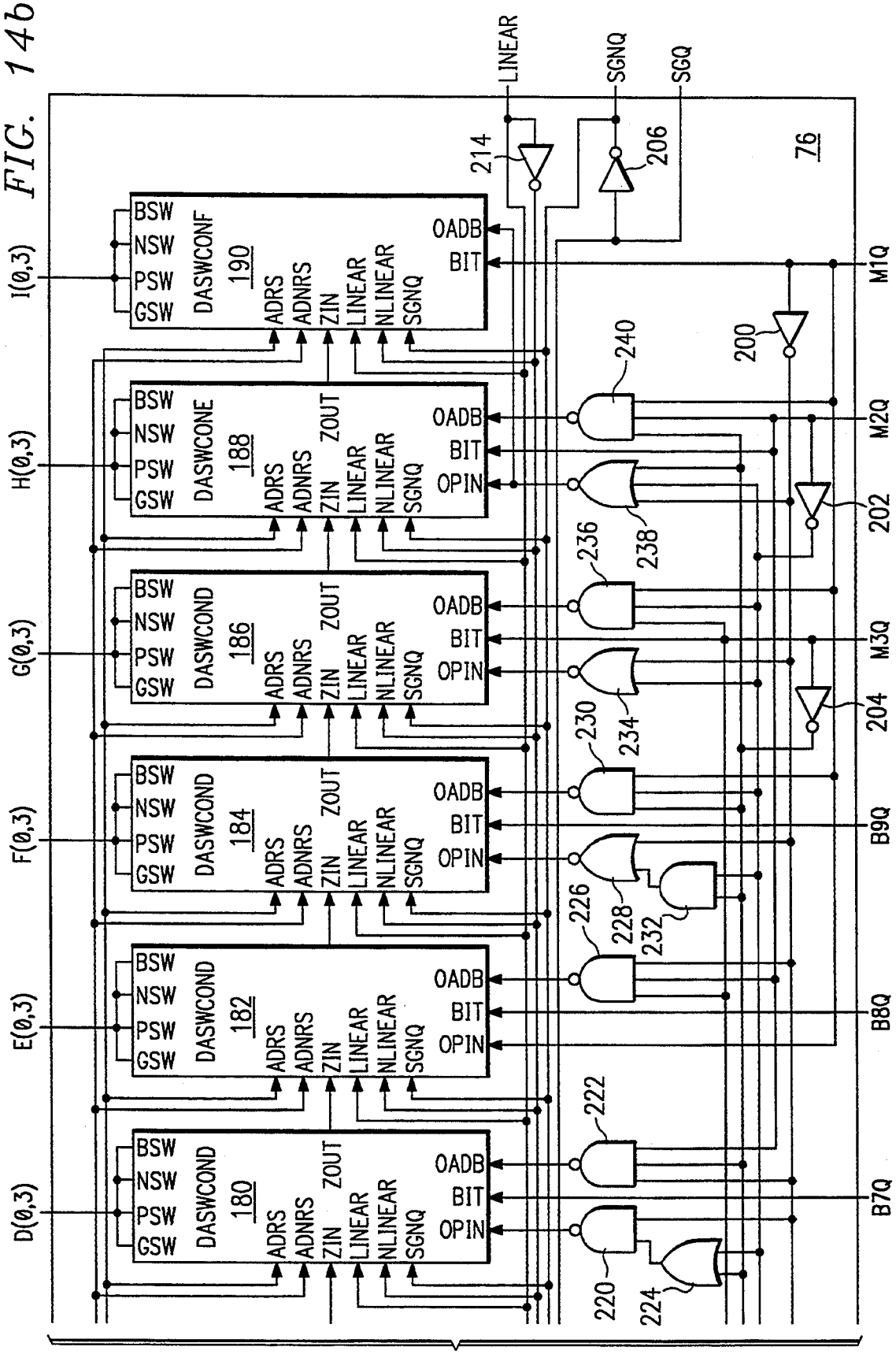

FIGS. 14a and 14b depict a high level diagram of the SEGDEC block 76 depicted in FIG. 5. SEGDEC block generates the four-line control buses B1A(0,3), B1B(0,3), B2(0,2), C(0,3) through I(0,3) and the signals ESAU and SGNQ. (B2(0,2) is a three-line control bus.) SEGDEC block 76 has inputs AU, ADSMD, M1Q through M3Q, B5Q through B9Q, SGQ and LINEAR. SEGDEC block 76 comprises a segment switch controller A block 172 labeled DASWCONA, a segment switch controller B block 174 labeled DASWCONB, a segment switch controller C block 176 labeled DASWCONC, five segment switch controller blocks 178, 180, 182, 184 and 186 labeled DASWCOND, a segment switch controller E block 188 labeled DASWCONE, and a segment switch controller F block 190 labeled DASWCONF.

The signal ESAU is generated by the output of a NAND gate 192. Gate 192 has inputs ADNRS and the output of a NAND gate 194. Gate 194 has inputs NLINEAR and the output of an OR gate 196. Gate 196 has inputs AU and the output of a three-input NAND gate 198. Gate 198 has inputs M1Q inverted by an inverter 200, M2Q inverted by an inverter 202, and M3Q inverted by an inverter 204. The output SGNQ is generated from the output of a NOR gate 206 connected to SGQ.

SEGDEC block 76 generates several signals for use internally. ADRS is generated from the input ADSMD buffered by inverters 208 and 210. The signal ADNRS is generated by the output of inverter 208. The signal NAU is generated from the input AU inverted by an inverter 212. The signal NLINEAR is generated from the input LINEAR inverted by an inverter 214.

DASWCONA block 172 generates the four-line control bus B1A(0,3). It has inputs ADRS, ADNRS, AU, NLINEAR, SGNQ, SGQ, OPIN and OADB. OPIN and OADB are connected to the output of gate 198. DASWCONA block 172 is further described in connection with FIG. 15.

DASWCONB block 174 generates the four-line control bus B1B(0,3). It has inputs ADRS, ADNRS, AU, NAU, LINEAR, NLINEAR, SGNQ, SGQ, OPIN, BIT and OADB. OPIN and OADB are connected to the output of gate 198. The input BIT is connected to B5Q. DASWCONB block 154 is further described in connection with FIG. 16.

DASWCONC block 176 generates the three-line control bus B2(0,2). It has inputs ADNRS, AU, LINEAR, SGNQ, SGQ and OPIN. OPIN is connected to the output of gate 198. In addition, the output signal ZOUT is connected to the input ZIN of DASWCOND block 178. DASWCONC block 176 is further described in connection with FIG. 17.

DASWCOND cells 178 through 186 generate the four-line control buses C(0,3) through G(0,3), respectively. Each cell has inputs ADRS, ADNRS, ZIN, LINEAR, NLINEAR, SGNQ, OPIN, BIT and OADB. In addition, each cell generates ZOUT which is fed to the adjacent cell as depicted. DASWCOND cells 178 through 186 are further described immediately below and in connection with FIG. 18.

In DASWCOND cell 178, the input BIT is connected to B6Q. The input signals OPIN and OADB are generated by the output of a two-input NAND gate 216 and a three-input NAND gate 218, respectively. Gate 216 has as its inputs the output of inverters 200 and 202. Gate 218 has inputs M3Q and the outputs of inverters 200 and 202.

In DASWCOND cell 180, the input BIT is connected to B7Q. The input OPIN and OADB are generated by the output of a two-input NAND gate 220 and a three-input NAND gate 222, respectively. Gate 220 has as inputs the output of an OR gate 224 and the output of inverter 200. Gate 224 has as inputs the output of inverters 202 and 204. Gate 222 has inputs M2Q and the outputs from inverters 200 and 204.

In DASWCOND cell 182, the inputs OPIN and BIT are connected to M1Q and BSQ, respectively. The input OADB is generated by the output of a three-input NAND gate 226. Gate 226 has inputs M3Q, M2Q and the output from inverter 200.

In DASWCOND cell 184, the input BIT is connected to B9Q. The inputs OPIN and OADB are generated by the output of a NOR gate 228 and a three-input NAND gate 230, respectively. Gate 228 has as its inputs the output of an AND gate 232 and the output of inverter 200. Gate 232 has as its inputs the output of inverters 202 and 204. Gate 230 has inputs M1Q and the output from inverters 202 and 204.

In DASWCOND cell 186, the input BIT is connected to M3Q. The inputs OPIN and OADB are generated by the output of a NOR gate 234 and a three-input NAND gate 236, respectively. Gate 234 has as its inputs the output of inverters 200 and 202. Gate 236 has inputs M3Q, M1Q and the output of inverter 202.

DASWCONE block 188 generates the four-line control bus H(0,3). It has inputs ADRS, ADNRS, ZIN, LINEAR, NLINEAR, SGNQ, OPIN, BIT and OADB. In addition, the output signal ZOUT is connected to the input ZIN of DASWCONF cell 190. The input BIT is connected to M2Q. The inputs OPIN and OADB are generated by the output of a three-input NOR gate 238 and a three-input NAND gate 240. Gate 238 has as its inputs the output from inverters 200, 202 and 204. Gate 240 has inputs M2Q, M1Q and the output from inverter 204. DASWCONE block 188 is further described in connection with FIG. 19.

DASWCONF block 190 generates the four-line control bus I(0,3). It has inputs ADRNS, ADNRS, ZIN, LINEAR, NLINEAR, SGNQ, BIT and OADB. The inputs BIT and OADB are connected to M1Q and to the output of gate 238, respectively. DASWCONF block 190 is further described in connected with FIG. 20.

1. Segment Switch Controller A

Figure 15:
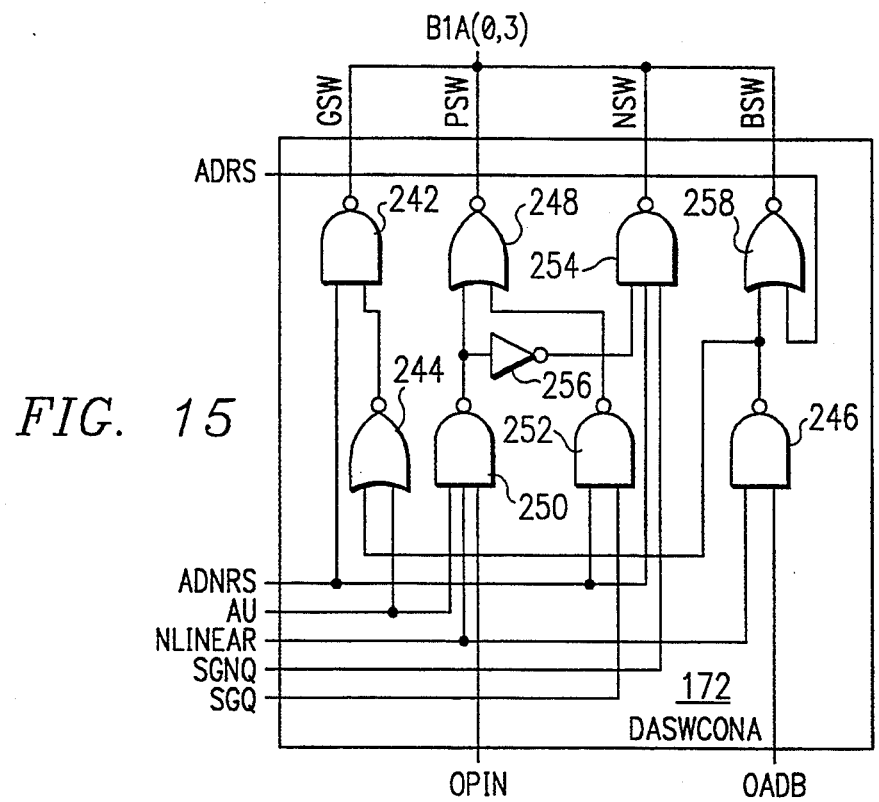

FIG. 15 depicts a schematic diagram of the DASWCONA block 172 depicted in FIG. 14a. The output GSW is generated by the output of a NAND gate 242. Gate 242 has inputs ADNRS and the output of a NOR gate 244. NOR gate 244 has inputs AU and the output from a NAND gate 246. NAND gate 246 has inputs NLINEAR and OADB.

The output PSW is generated by the output of a NOR gate 248. Gate 248 has as its inputs the output of a three-input NAND gate 250 and of a two-input NAND gate 252. Gate 250 has inputs AU, NLINEAR and OPIN. Gate 252 has inputs ADNRS and SGQ.

The output NSW is generated by the output of a three-input NAND gate 254. NAND gate 254 has inputs ADNRS, SGNQ and the output from gate 250 inverted by an inverter 256.

The output DSW is generated by the output of a NOR gate 258. Gate 258 has inputs ADRS and the output from gate 246.

2. Segment Switch Controller B

Figure 16:
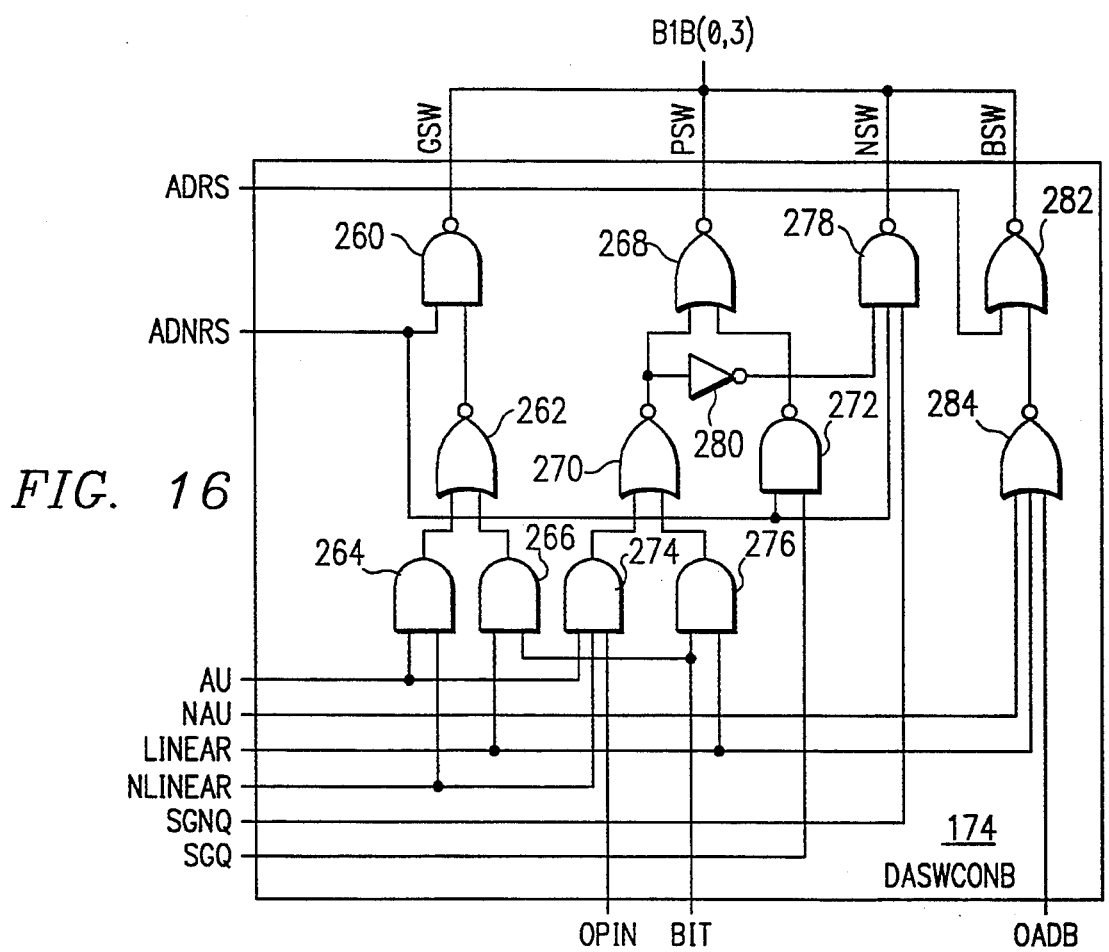

FIG. 16 depicts a schematic diagram of the DASWCONB block 174 depicted in FIG. 14a. The output GSW is generated by the output of a NAND gate 260. Gate 260 has inputs ADNRS and the output of a NOR gate 262. Gate 262 has as its inputs the output from an AND gate 264 and of an AND gate 266. Gate 264 has inputs AU and NLINEAR. Gate 266 has inputs LINEAR and BIT.

The output PSW is generated by the output of a NOR gate 268. Gate 268 has as its inputs the output of a NOR gate 270 and of a NAND gate 272. Gate 270 has as its inputs the output from a three-input AND gate 274 and of an AND gate 276. Gate 274 has inputs AU, NLINEAR and OPIN. Gate 276 has inputs BIT and LINEAR.

The output NSW is generated by the output of the three-input NAND gate 278. Gate 278 has inputs ADNRS, SGNQ and the output from gate 270 inverted by an inverter 280.

The output DSW is generated by the output of a NOR gate 282. Gate 282 has inputs ADRS and the output from a three-input NOR gate 284. Gate 284 has inputs NAU, LINEAR and OADB.

3. Segment Switch Controller C

Figure 17:
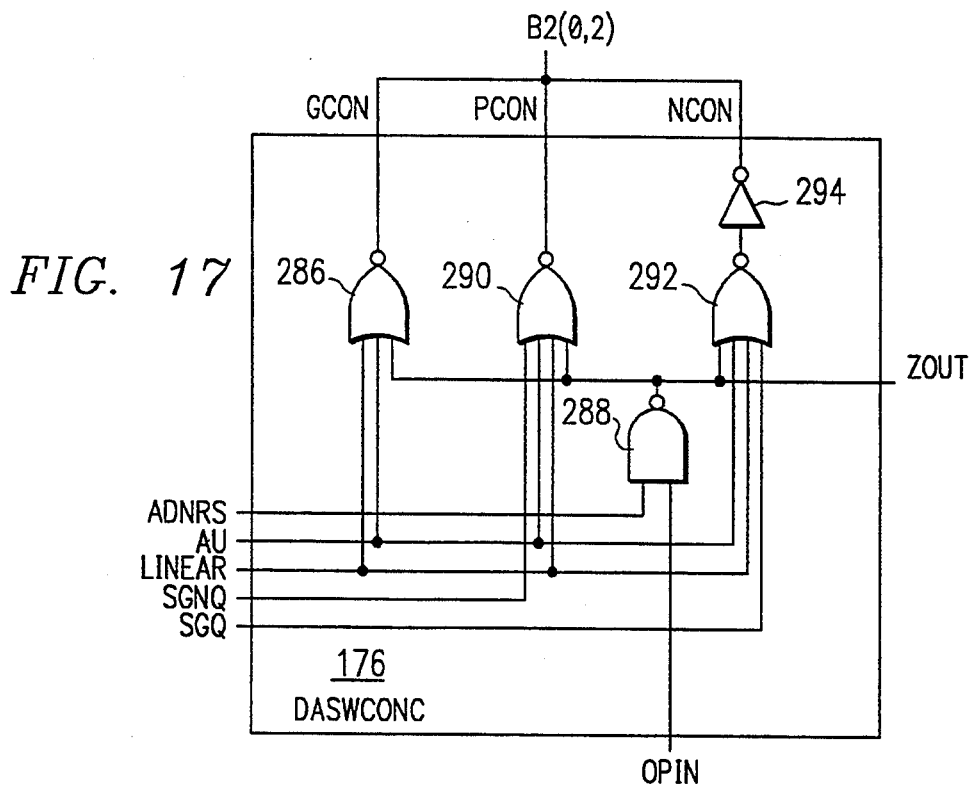

FIG. 17 depicts a schematic diagram of the DASWCONC block 176 depicted in FIG. 14a. The output GCON is generated by the output of a three-input NOR gate 286. Gate 286 has inputs LINEAR, AU and the output of a NAND gate 288. Gate 288 has inputs ADNRS and OPIN.

The output PCON is generated by the output of a four-input NOR gate 290. Gate 290 has inputs SGNQ, AU, LINEAR and the output of gate 288.

The output NCON is generated by the output of a four-input NOR gate 292 inverted by an inverter 294. Inverter 292 has inputs AU, LINEAR, SGQ and the output from gate 288.

Internal signal ZOUT is generated by the output of gate 288.

4. Segment Switch Controller D

Figure 18:
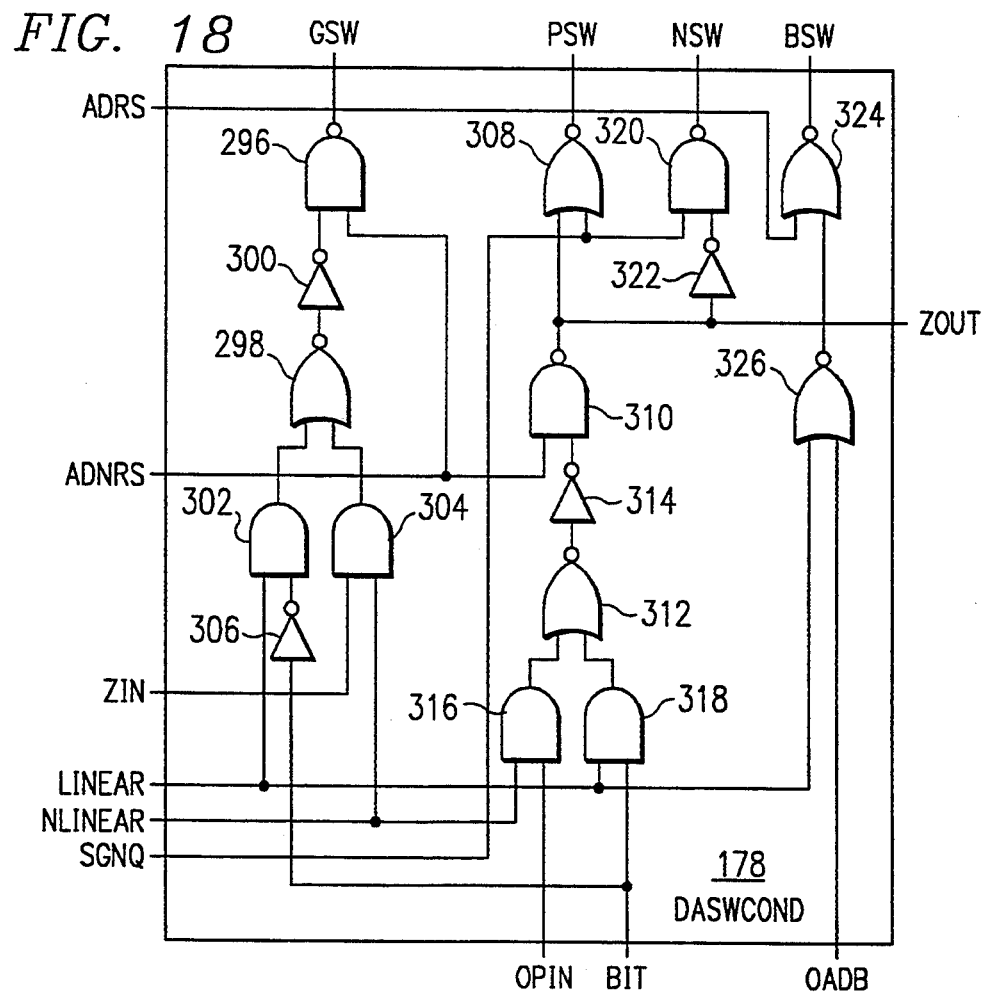
FIG. 18 depicts a schematic diagram of the DASW-COND cell depicted in FIGS. 14a and 14b.

FIG. 18 depicts a schematic diagram of the DASWCOND cell depicted in FIGS. 14a and 14b. The output GSW is generated by the output of a NAND gate 296. Gate 296 has inputs ADNRS and the output of a NOR gate 298 inverted by an inverter 300. Gate 298 has as its inputs the output of an AND gate 302 and of an AND gate 304. Gate 302 has inputs LINEAR and BIT inverted by an inverter 306. Gate 304 has inputs ZIN and NLINEAR.

The output PSW is generated by the output of a NOR gate 308. Gate 308 has inputs SGNQ and the output of a NAND gate 310. Gate 310 has inputs ADNRS and the output of a NOR gate 312 inverted by an inverter 314. Gate 312 has as its inputs the output of an AND gate 316 and of an AND gate 318. Gate 316 has inputs NLINEAR and OPIN. Gate 318 has inputs LINEAR and BIT.

The output NSW is generated by the output of a NOR gate 320. Gate 320 has inputs SGNQ and the output of gate 310 inverted by an inverter 322.

The output BSW is generated by the output of a NOR gate 324. Gate 324 has inputs ADRS and the output of a NOR gate 326. Gate 326 has inputs LINEAR and OADB.

The internal signal ZOUT is generated by the output of gate 310.

5. Segment Switch Controller E

Figure 19:
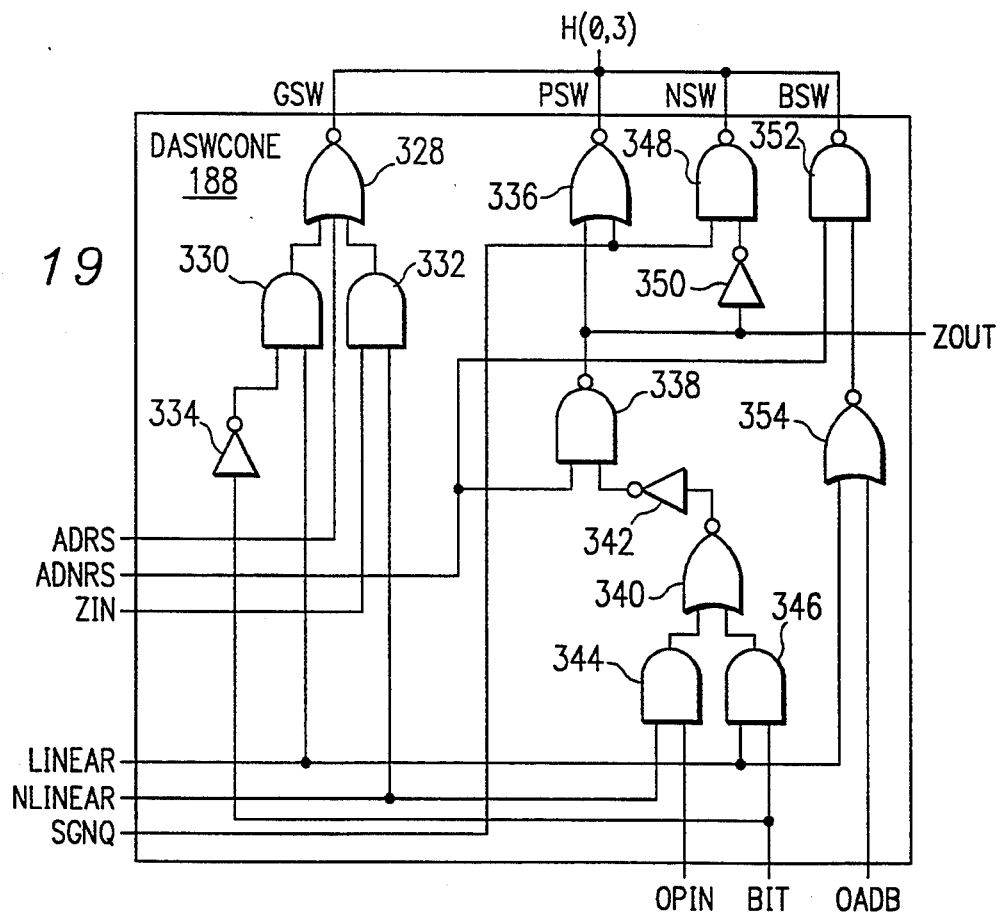
FIG. 19 depicts a schematic diagram of the DASW-CONE block depicted in FIG. 14b.

FIG. 19 depicts a schematic diagram of the DASW-CONE block 188 depicted in FIG. 14b. The output GSW is generated by the output of a three-input NOR gate 328. Gate 328 has inputs ADRS and the output of an AND gate 330 and of an AND gate 332. Gate 330 has inputs BIT inverted by an inverter 334 and LINEAR. Gate 332 has inputs ZIN and NLINEAR.

The output PSW is generated by the output of a NOR gate 336. Gate 336 has inputs SGNQ and the output of a NAND gate 338. Gate 338 has inputs ADNRS and the output of a NOR gate 340 inverted by an inverter 342. Gate 340 has as its inputs the output of an AND gate 344 and of an AND gate 346. Gate 344 has inputs NLINEAR and OPIN. Gate 346 has inputs LINEAR and BIT.

The output NSW is generated by the output of a NAND gate 348. Gate 348 has inputs SGNQ and the output of gate 338 inverted by an inverter 350.

The output BSW is generated by the output of a NAND gate 352. Gate 352 has inputs ADNRS and the output from a NOR gate 354. Gate 354 has inputs LINEAR and OADB.

The internal signal ZOUT is generated by the output of gate 338.

In operation, DASWCONE does not couple capacitor C15 to the ANALOG INPUT. This attenuates the input voltage level by approximately 25% without losing any converter resolution or precision.

6. Segment Switch Controller F

Figure 20:
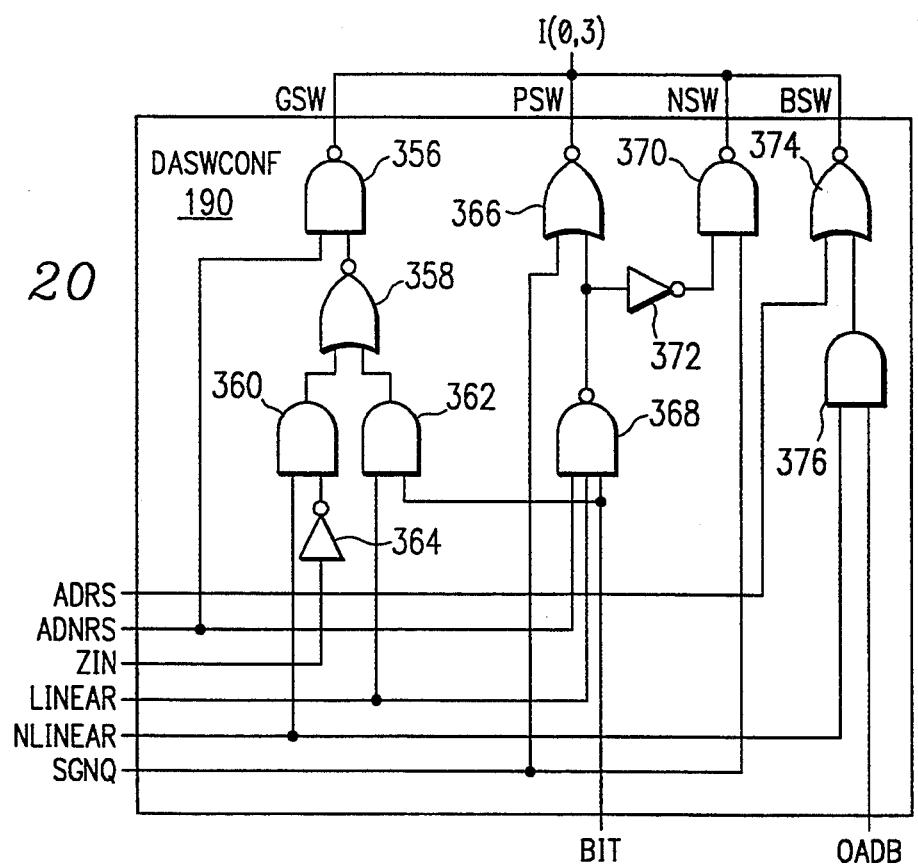
FIG. 20 depicts a schematic diagram of the DASW-CONF block depicted in FIG. 14b.

FIG. 20 depicts a schematic diagram of the DASW-CONF block 190 depicted in FIG. 14b. The output GSW is generated by the output of a NAND gate 356. Gate 356 has inputs ADNRS and the output from a NOR gate 358. Gate 358 has as its inputs the output of an AND gate 360 and of an AND gate 362. Gate 360 has inputs NLINEAR and ZIN inverted by an inverter 364. Gate 362 has inputs LINEAR and BIT.

The output PSW is generated by the output of a NOR gate 366. Gate 366 has inputs SGNQ and the output of a three-input NAND gate 368. Gate 368 has inputs ADNRS, LINEAR and BIT.

The output NSW is generated by the output of a NAND gate 370. Gate 370 has inputs SGNQ and the output of gate 368 inverted by an inverter 372.

The output BSW is generated by the output of a NOR gate 374. Gate 374 has inputs ADRS and the output of an AND gate 376. Gate 376 has inputs NLINEAR and OADB.

K. Successive Approximation Register

Figure 21:
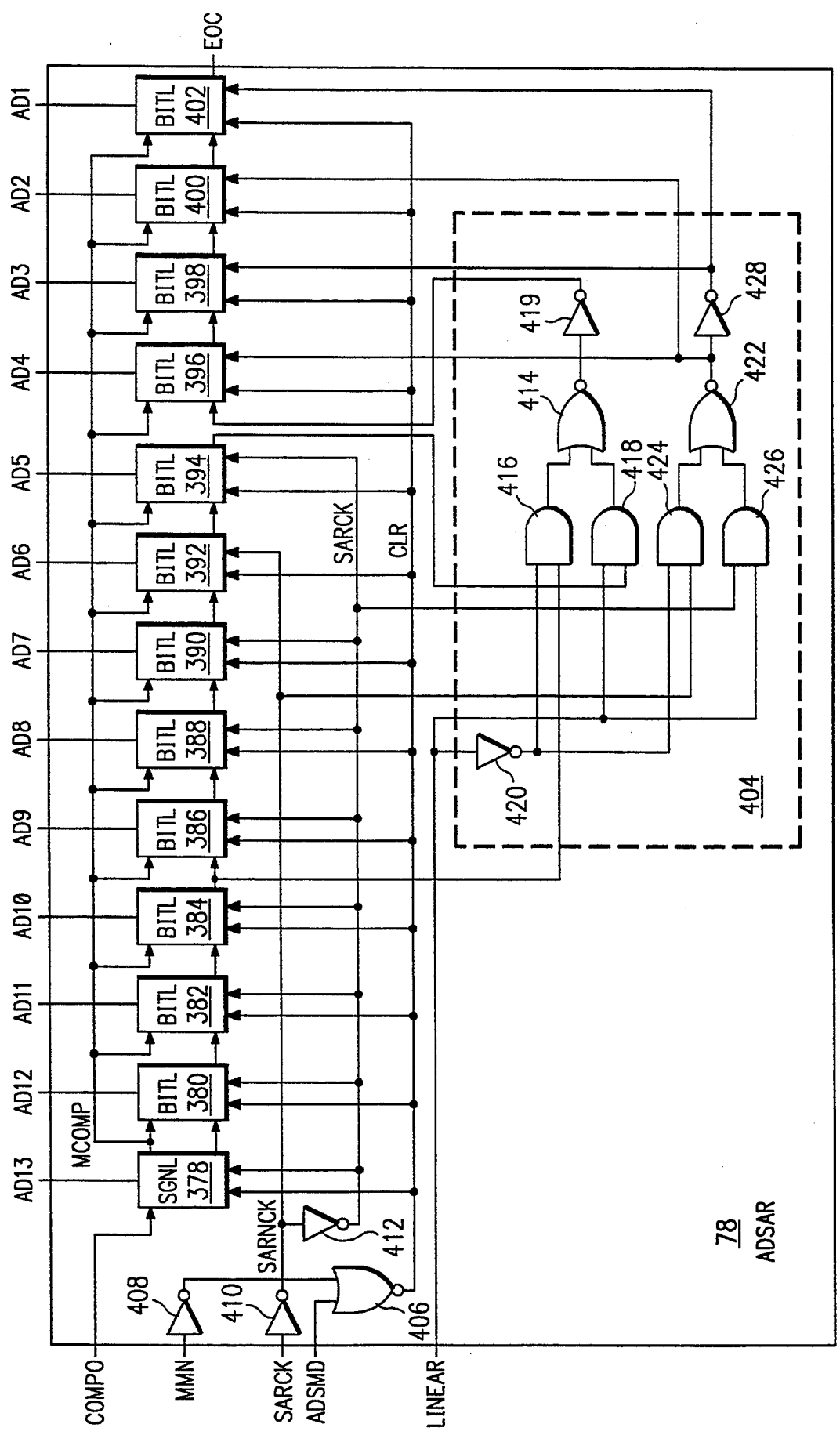
FIG. 21 depicts a high level diagram of the block ADSAR depicted in FIG. 5.

FIG. 21 depicts a high level diagram of the ADSAR block 78 depicted in FIG. 5. ADSAR block 78 generates the 13 bit DIGITAL OUTPUT, AD1 through AD13, and the end-of-conversion signal EOC. AD1 through AD13 comprises the provisional binary word prior to completion of the analog to digital conversion. ADSAR block 78 has inputs COMPO, MMN, SARCK, ADSMD and LINEAR. ADSAR block 78 comprises a sign latch 378 labeled SGNL, twelve one-bit latches 380 through 402 labeled BITL and a logic block 404. Internal signal CLR is generated by the output of a NOR gate 406. Gate 406 has inputs ADSMD and MMN inverted by inverter 408. The internal signal SARNCK is generated by the output of an inverter 410 connected to SARCK. The output of gate 410 is inverted a second time by inverter 412 to generate the signal SARCK as that signal is used by block 378 and cells 380 through 394.

Figure 22:
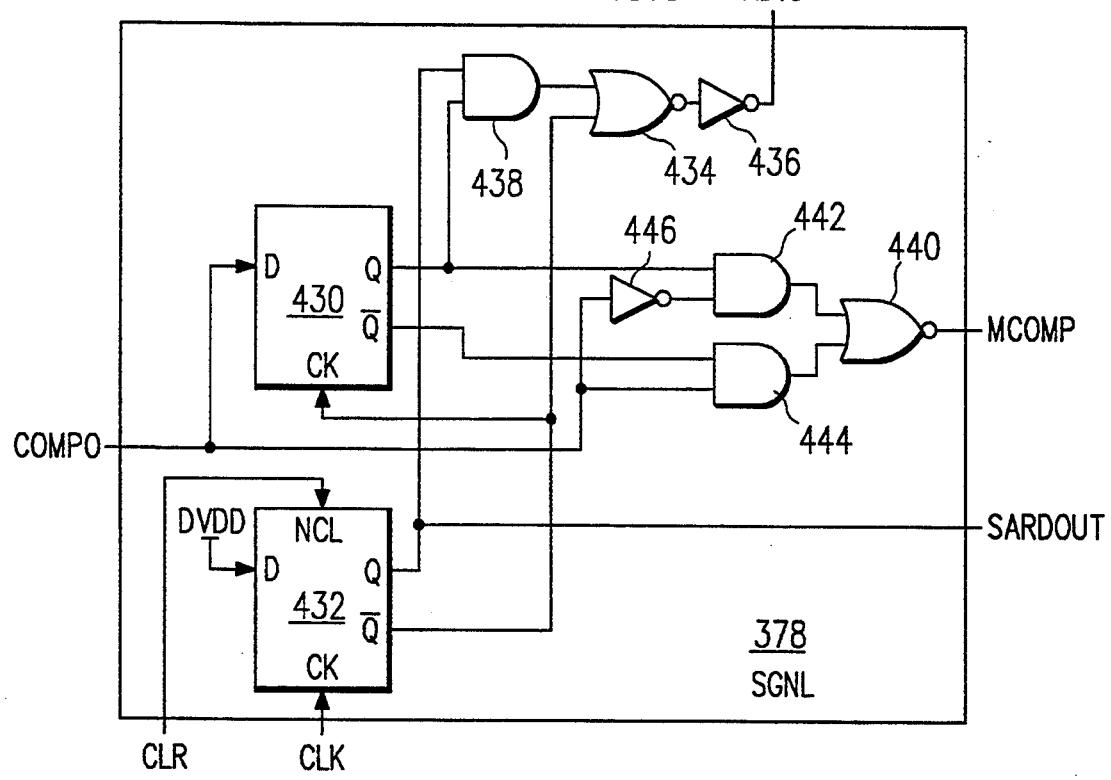
FIG. 22 depicts a schematic diagram of the SIGL block SGNL depicted in FIG. 21.

SGNL block 378 generates outputs AD13, MCOMP and a clocking signal SARDOUT (depicted in FIG. 22). It has inputs COMPO, CLR and SARCK. SGNL block 378 generates the (13-n)th bit of the provisional binary word during the nth conversion step. SGNL block 378 outputs this signal as MCOMP. MCOMP is latched into the (13-n)th BITL cell by SARDOUT at the completion of the nth conversion step. The first BITL cell generates AD1, the second cell generates AD2, etc. SARDOUT is a low-to-high logic signal which ripples sequentially through BITL cells 380 through 402. MCOMP is set by COMPO. After latch 430 latches AD13, MCOMP is also a function of AD13. When the sign bit is positive, MCOMP is COMPO. When the sign bit is negative, MCOMP is the logic inverse of COMPO. SGNL block 378 is more fully described in connection with FIG. 22.

Figure 23:
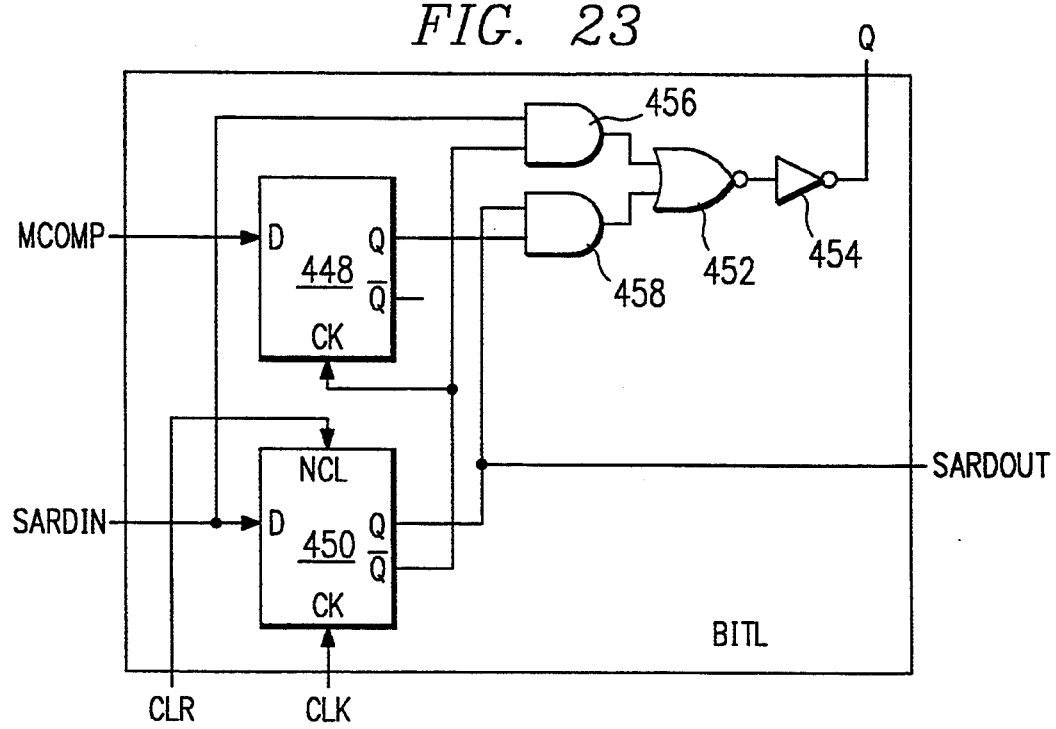
FIG. 23 depicts a schematic diagram of the BITL cell depicted in FIG. 21.

Bit cells 380 through 402 generate the twelfth through first digital output bits, AD12 through AD1, respectively, and the signal SARDOUT (depicted in FIG. 23). Each BITL cell has inputs MCOMP, SARDIN and CLR. Cells 380 through 390 and cell 392 have the input SARCK while cells 396 through 492 have an input from logic block 404 as will be more fully described below. Cell 392 has input SARNCK. In addition, cell 396 has its input SARDIN generated from logic block 404. Each cell 378 through 402 generates one bit as depicted of the binary provisional word from MCOMP. At the end of the conversion process, BITL cells 378 through 402 generate outputs AD12 through AD1. The input SARDIN insures that only one cell of cells 380 through 402 is active at a time and that only the nth cell is active during the nth conversion step. BITL cells 378 through 402 are further described in connection with FIG. 23.

Digital block 404 causes BITL cells 396 through 402 to latch five conversion steps earlier in either of the companding modes. This insures that the four least significant bits are latched by cells 396 through 402 and output on AD4 through AD1. The input SARDIN to BITL cell 396 is generated from the output of a NOR gate 414 inverted by inverter 416. Gate 414 has as its inputs the output of an AND gate 416 and of an AND gate 418. Gate 416 has as its inputs LINEAR inverted by an inverter 420 and the output SARDOUT of BITL cell 384. Gate 418 has inputs LINEAR and SARDOUT from BITL cell 394. The input CLK to BITL cells 396 and 400 is generated by the output of a NOR gate 422. Gate 422 has as its inputs the output of an AND gate 424 and of an AND gate 426. Gate 424 has inputs SARNCK and the output from inverter 420. Gate 426 has inputs SARCK and LINEAR. The input CLK to BITL cells 398 and 402 is generated by the output of gate 422 inverted by an inverter 428.

1. Sign Bit Latch

FIG. 22 depicts a schematic diagram of the SGNL block 378 depicted in FIG. 21. SGNL block 378 comprises a first D-type flip-flop 430 and a second D-type flip-flop 432. The input of flip-flop 432 is connected to a positive power supply DVDD. The clock ("CK") and clear ("NCL") inputs of flip-flop 432 are tied to the input CLK and CLR, respectively. Flip-flop 430 has its input connected to COMPO. The clock input ("CK") of the flip-flop 430 is connected to the inverting output of flip-flop 432.

Output AD13 generated by the output of a NOR gate 434 inverted by inverter 436. Gate 434 has as its inputs the output of an AND gate 438 and the output of flip-flop 432.

Output MCOMP is generated by the output of a NOR gate 440. Gate 440 has as its inputs the output of an AND gate 442 and of an AND gate 444. Gate 442 has as its inputs the output of flip-flop 430 and COMPO inverted by an inverter 446. Gate 444 has as its inputs, the inverted output of flip-flop 430 and COMPO.

The output SARDOUT is generated by the output of flip-flop 432.

Initially, the output of flip-flop 432 is cleared by the signal CLR. The conversion begins when flip-flop 432 is enabled by CLR returning to high. CLR is generated from ADSMD (ADLD delayed). While flip-flop 432 is cleared, the ANALOG INPUT is sampled and held by the ADC. Comparator 32 (depicted in FIG. 7) compares ANALOG INPUT to DAVGND and generates COMPO. The CLK input to flip-flop 432 generates a low-to-high transition on SARDOUT, one clock cycle later. This transition latches COMPO in flip-flop 430. The low-to-high transition on SARDOUT then ripples through BITL cells 380 to 402. The output of flip-flop 432 does not change during the remainder of the conversion because DVDD is tied high. AD13 indicates the final latched value of COMPO after the first conversion step.

The output MCOMP generates each subsequent bit in the provisional binary word. MCOMP is COMPO if AD13 is a logic one. MCOMP is the inverse of COMPO if AD13 is a logic zero. COMPO is a logic one if the provisional binary word generates an analog voltage less than ANALOG INPUT. COMPO is a logic zero if the provisional binary word generates an analog voltage greater then ANALOG INPUT.

2. Bit Latch

FIG. 23 depicts a schematic diagram of the BITL cell depicted in FIG. 21. BITL cell comprises A first type D-type flip--flop 448 and a second D-type flip-flop 50. The input of flip-flop 450 is connected to SARDIN. The clock ("CK") and clear ("NCL") inputs of flip-flop 50 are connected to CLK and CLR, respectively. Flip-flop 448 has its input connected to MCOMP the clock input ("CK") of flip-flop 448 is connected to the inverting output of flip-flop.

The output bit Q is generated by the output of a NOR gate 452 inverted by an inverter 454. Gate 452 has as its inputs, the output of an AND gate 456 and of an AND gate 458. Gate 456 has inputs SARDIN and the inverted output of flip-flop 450. Gate 458 has as its inputs the output of flip-flops 448 and 450. The particular bit of the DIGITAL OUTPUT to which Q corresponds depends upon the position of BITL cell in ADSAR block 78.

The output SARDOUT is generated by the output of flip-flop 450.

Initially, SARDIN is zero and the output of flip-flop 450 is cleared by the input CLR. The try bit, Q, of the provisional binary word is SARDIN, or a logic zero. Eventually, the input SARDIN goes high when the output SARDOUT of SGNL block 378 reaches the (13-n)th BITL cell in the n-th conversion step. SARDIN then causes the try bit, Q, to go high. The comparator then compares the ANALOG INPUT with the analog voltage generated by provisional binary word. Flip-flop 448 latches MCOMP one clock cycle later by the high-to-low transition of the inverted output of flip-flop 450. Flip-flop 448 outputs MCOMP on its non-inverting output. The output of flip-flop 448 does not change during the remainder of the conversion because SARDIN remains high.

As described above, MCOMP will reflect whether the provisional binary word is higher or lower than the ANALOG INPUT and whether AD13 is high or low.

The output EOC is generated from SARDOUT of BITL cell 402.

Although the present invention and its advantages have been described in detail, it should be understood that various changes, substitutions and alterations can be made here and without departing from the spirit and scope of the invention as defined by the appended claims.

What is claimed is:

1. A multi-mode analog to digital converter comprising:
   a comparator for comparing an input voltage level and a generated voltage level;
   a successive approximation register for generating a provisional binary word responsive to the output of the comparator;
   control circuitry for selecting a transfer function, the transfer function selected from the group consisting of linear and companding; and
   a charge redistribution device for generating the generated voltage responsive to the provisional binary word and to the selected transfer function.

2. The converter of claim 1 wherein the charge redistribution device is responsive to a selected one of an A-law companding and $\mu$-law companding transfer function.

3. The converter of claim 1 wherein the charge redistribution device further comprises:
   a first array of capacitors for generating a first voltage level at a first node, a first terminal of each of the capacitors coupled to the first node;
   a second array of capacitors for generating the voltage at an output node, a first terminal of each of the capacitors coupled to the output node;
   a scaling capacitor having first and second terminals, the first terminal coupled to the first node, the second terminal coupled to an intermediate node; and
   switching circuitry for selectively coupling ones of the first and second arrays of capacitors to voltages of first and second sets of voltages respectively, the second set of voltages comprising the voltage at the intermediate node.

4. The converter of claim 1 further comprising circuitry for attenuating the input voltage level a predetermined amount.

5. The converter of claim 4 wherein the charge redistribution device is selectably responsive to an A-law companding and $\mu$-law companding transfer function.

6. A multi-mode analog to digital converter comprising:
   a comparator for comparing an input voltage level and a generated voltage level;
   a successive approximation register for generating a provisional binary word responsive to the output of the comparator;
   a first array of capacitors for generating a first voltage level at a first node, a first terminal of each of the capacitors coupled to the first node;
   a second array of capacitors for generating the generated voltage at an output node, a first terminal of each of the capacitors coupled to the output node;

a scaling capacitor having first and second terminals, the first terminal coupled to the first node and the second terminal coupled to an intermediate node;

control circuitry for selecting a transfer function, the transfer function selected from the group consisting of linear and companding; and switching circuitry for selectively coupling ones of the first and second arrays of capacitors to voltages of first and second sets of voltages, respectively, the second set of voltages comprising the voltage at the intermediate node, the circuitry responsive to the selected transfer function.

7. The converter of claim 6 further comprising circuitry for attenuating the input voltage level a predetermined amount.

8. A method for converting an analog voltage level to a digital word comprising the steps of:

providing a signal to a control circuit for selecting a transfer function, the transfer function selected from the group consisting of linear and companding;

generating a voltage level at a first node, the voltage level responsive to a provisional binary word and to the selected transfer function;

comparing the generated voltage level to the analog voltage level with a comparator; and modifying the provisional binary word responsive to the output of the comparator.

9. The method of claim 8 wherein the step of generating a voltage level further comprises the steps of:

generating an intermediate voltage level at an intermediate node, the node coupled to a first terminal of a scaling capacitor, the second terminal of the scaling capacitor coupled to a first terminal of each capacitor of a first array of capacitors;

generating an output voltage at an output node, the node coupled to a first terminal of each capacitor of a second array of capacitors;

selectively switching a voltage level to a second terminal of each capacitor in the first array, the voltage levels selected from a first set of voltage levels; and selectively switching a voltage level to a second terminal of each capacitor in the second array, the voltages selected from a second set of voltage levels including the voltage at the intermediate node.

* * * * *